(12) United States Patent
Raisanen et al.

(10) Patent No.: US 8,802,201 B2
(45) Date of Patent: Aug. 12, 2014

(54) SYSTEMS AND METHODS FOR THIN-FILM DEPOSITION OF METAL OXIDES USING EXCITED NITROGEN-OXYGEN SPECIES

(75) Inventors: Petri Raisanen, Gilbert, AZ (US); Jung Sung-hoon, Tempe, AZ (US); Verghese Mohith, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 13/339,609

(22) Filed: Dec. 29, 2011

(65) Prior Publication Data

US 2012/0098107 A1  Apr. 26, 2012

Related U.S. Application Data

(63) Continuation-in-part of application No. 12/854,818, filed on Aug. 11, 2010, and a continuation-in-part of application No. 13/102,980, filed on May 6, 2011.

(60) Provisional application No. 61/234,017, filed on Aug. 14, 2009, provisional application No. 61/332,600, filed on May 7, 2010.

(51) Int. Cl.
   *H05H 1/24* (2006.01)
(52) U.S. Cl.
   USPC ........................ 427/569; 427/248.1
(58) Field of Classification Search
   USPC .............................. 427/248.1, 569
   See application file for complete search history.

(56) References Cited

U.S. PATENT DOCUMENTS

| | | |
|---|---|---|
| 3,833,492 A | 9/1974 | Bollyky |
| 3,854,443 A | 12/1974 | Baerg |
| 4,058,430 A | 11/1977 | Suntola et al. |
| 4,389,973 A | 6/1983 | Suntola et al. |
| 5,199,603 A | 4/1993 | Prescott |
| 5,380,367 A | 1/1995 | Bertone |
| 5,595,606 A | 1/1997 | Fujikawa et al. |
| 5,836,483 A | 11/1998 | Disel |
| 5,855,680 A | 1/1999 | Soininen et al. |
| 6,013,553 A | 1/2000 | Wallace |
| 6,086,677 A | 7/2000 | Umotoy et al. |
| 6,148,761 A | 11/2000 | Majewski et al. |
| 6,161,500 A | 12/2000 | Kopacz et al. |
| 6,287,965 B1 | 9/2001 | Kang et al. |
| 6,302,964 B1 | 10/2001 | Umotoy et al. |
| 6,342,427 B1 | 1/2002 | Choi et al. |
| 6,368,987 B1 | 4/2002 | Kopacz et al. |

(Continued)

FOREIGN PATENT DOCUMENTS

| | | |
|---|---|---|
| CN | 1563483 A | 12/2006 |
| CN | 101423937 A | 9/2011 |

(Continued)

OTHER PUBLICATIONS

USPTO; Office Action dated Aug. 27, 2010 in U.S. Appl. No. 12/118,596.

(Continued)

*Primary Examiner* — Elizabeth Burkhart
(74) *Attorney, Agent, or Firm* — Snell & Wilmer LLP

(57) ABSTRACT

The present invention relates to a process and system for depositing a thin film onto a substrate. One aspect of the invention is depositing a thin film metal oxide layer using atomic layer deposition (ALD).

19 Claims, 13 Drawing Sheets

(56) References Cited

U.S. PATENT DOCUMENTS

| | | |
|---|---|---|
| 6,420,279 B1 | 7/2002 | Ono et al. |
| 6,478,872 B1 | 11/2002 | Chae et al. |
| 6,511,539 B1 | 1/2003 | Raaijmakers |
| 6,590,251 B2 | 7/2003 | Kang et al. |
| 6,627,503 B2 | 9/2003 | Ma et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,858,547 B2 | 2/2005 | Metzner |
| 6,875,677 B1 | 4/2005 | Conley, Jr. et al. |
| 6,930,059 B2 | 8/2005 | Conley, Jr. et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,205,247 B2 | 4/2007 | Lee et al. |
| 7,235,501 B2 | 6/2007 | Ahn et al. |
| 7,312,494 B2 | 12/2007 | Ahn et al. |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,547,363 B2 | 6/2009 | Tomiyasu et al. |
| 7,601,223 B2 | 10/2009 | Lindfors et al. |
| 7,601,225 B2 | 10/2009 | Tuominen et al. |
| D614,153 S | 4/2010 | Fondurulia et al. |
| 7,851,019 B2 | 12/2010 | Tuominen et al. |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,293,016 B2 | 10/2012 | Bahng et al. |
| 8,309,173 B2 | 11/2012 | Tuominen et al. |
| 2002/0001974 A1 | 1/2002 | Chan |
| 2002/0064592 A1 | 5/2002 | Datta et al. |
| 2002/0172768 A1 | 11/2002 | Endo et al. |
| 2003/0075925 A1 | 4/2003 | Lindfors et al. |
| 2003/0232138 A1 | 12/2003 | Tuominen et al. |
| 2004/0013577 A1 | 1/2004 | Ganguli et al. |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0219793 A1 * | 11/2004 | Hishiya et al. ............... 438/706 |
| 2005/0008799 A1 | 1/2005 | Tomiyasu et al. |
| 2005/0023624 A1 | 2/2005 | Ahn et al. |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0110069 A1 | 5/2005 | Kil et al. |
| 2005/0173003 A1 | 8/2005 | Laverdiere et al. |
| 2005/0212119 A1 * | 9/2005 | Shero et al. ............... 257/705 |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0271813 A1 | 12/2005 | Kher et al. |
| 2006/0013946 A1 | 1/2006 | Park et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0031599 A1 | 2/2007 | Gschwandtner et al. |
| 2007/0037412 A1 | 2/2007 | Dip et al. |
| 2007/0049053 A1 * | 3/2007 | Mahajani ............... 438/785 |
| 2007/0059948 A1 | 3/2007 | Metzner et al. |
| 2007/0065578 A1 | 3/2007 | McDougall |
| 2007/0066010 A1 | 3/2007 | Ando |
| 2007/0116873 A1 | 5/2007 | Li et al. |
| 2007/0134942 A1 | 6/2007 | Ahn et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0252244 A1 | 11/2007 | Srividya et al. |
| 2008/0054332 A1 | 3/2008 | Kim et al. |
| 2008/0057659 A1 | 3/2008 | Forbes et al. |
| 2008/0075881 A1 * | 3/2008 | Won et al. ............... 427/539 |
| 2008/0124908 A1 | 5/2008 | Forbes et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0261413 A1 | 10/2008 | Mahajani |
| 2008/0282970 A1 | 11/2008 | Heys et al. |
| 2009/0011608 A1 | 1/2009 | Nabatame |
| 2009/0020072 A1 | 1/2009 | Mizunaga et al. |
| 2009/0095221 A1 | 4/2009 | Tam et al. |
| 2009/0211525 A1 | 8/2009 | Sarigiannis et al. |
| 2009/0283041 A1 | 11/2009 | Tomiyasu et al. |
| 2010/0024727 A1 | 2/2010 | Kim et al. |
| 2010/0322604 A1 | 12/2010 | Fondurulia et al. |
| 2012/0090704 A1 | 4/2012 | Laverdiere et al. |
| 2012/0160172 A1 | 6/2012 | Wamura et al. |
| 2012/0240858 A1 | 9/2012 | Taniyama et al. |
| 2012/0304935 A1 | 12/2012 | Oosterlaken et al. |

FOREIGN PATENT DOCUMENTS

| | | |
|---|---|---|
| JP | 2004014952 A | 1/2004 |
| TW | 200701301 A | 1/2007 |
| WO | 2006/056091 A1 | 6/2006 |

OTHER PUBLICATIONS

USPTO; Office Action dated Feb. 15, 2011 in U.S. Appl. No. 12/118,596.

USPTO; Notice of Allowance dated Aug. 4, 2011 in U.S. Appl. No. 12/118,596.

USPTO; Notice of Allowance dated Jun. 16, 2011 in U.S. Appl. No. 12/430,751.

USPTO; Notice of Allowance dated Jul. 27, 2011 in U.S. Appl. No. 12/430,751.

PCT; International Search report and Written Opinion dated Nov. 12, 2010 in Application No. PCT/US2010/030126.

PCT; International Search report and Written Opinion dated Jan. 12, 2011 in Application No. PCT/US2010/045368.

Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.

Maeng et al. Electrical properties of atomic layer disposition Hf02 and HfOxNy on Si substrates with various crystal orientations, Journal of the Electrochemical Society, 2008-04, p. H267-H271, vol. 155, No. 4, Department of Materials Science and Engineering, Pohang University of Science and Technology, Pohang, Korea.

USPTO; Office Action dated Apr. 23, 2013 in U.S. Appl. No. 12/763,037.

USPTO; Office Action dated Jan. 15, 2013 in U.S. Appl. No. 12/754,223.

(56) References Cited

OTHER PUBLICATIONS

USPTO; Office Action dated Feb. 26, 2013 in U.S. Appl. No. 12/754,223.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
USPTO; Office Action dated Dec. 6, 2012 in U.S. Appl. No. 12/854,818.
Chinese Patent Office; Office Action dated Jan. 10, 2013 is Serial No. 201080015699.9.
Novaro et al. Theoretical Study on a Reaction Pathway of Ziegler-Natta-Type Catalysis, J. Chem. Phys. 68(5), Mar. 1, 1978 p. 2337-2351.

* cited by examiner

SYSTEMS AND METHODS FOR THIN-FILM DEPOSITION OF METAL OXIDES USING EXCITED NITROGEN-OXYGEN SPECIES

CROSS-REFERENCE TO RELATED APPLICATIONS

This application is a continuation-in-part of U.S. application Ser. No. 12/854,818, filed Aug. 11, 2010 and entitled "SYSTEMS AND METHODS FOR THIN-FILM DEPOSITION OF METAL OXIDES USING EXCITED NITROGEN-OXYGEN SPECIES," which claims priority from Provisional Patent Application No. 61/234,017, filed Aug. 14, 2009 and entitled "SYSTEMS AND METHODS FOR THIN-FILM DEPOSITION OF METAL OXIDES USING EXCITED NITROGEN-OXYGEN SPECIES" and from Provisional Patent Application No. 61/332,600, filed May 7, 2010 and entitled "SYSTEMS AND MEHTODS FOR THIN-FILM DEPOSITION OF METAL OXIDES USING EXCITED NITROGEN-OXYGEN SPECIES," the disclosure of each, that is not inconsistent with this disclosure, is hereby incorporated by reference.

This application is also a continuation-in-part of U.S. application Ser. No. 13/102,980, filed May 6, 2011 and entitled "SYSTEMS AND METHODS FOR THIN-FILM DEPOSITION OF METAL OXIDES USING EXCITED NITROGEN-OXYGEN SPECIES," which claims priority from Provisional Patent Application No. 61/332,600, filed May 7, 2010 and entitled "SYSTEMS AND MEHTODS FOR THIN-FILM DEPOSITION OF METAL OXIDES USING EXCITED NITROGEN-OXYGEN SPECIES," the disclosure of each, that is not inconsistent with this disclosure, is hereby incorporated by reference.

FIELD OF THE INVENTION

The present invention relates to thin film deposition, and more particularly to systems and methods depositing metal oxides by atomic layer deposition using ozone and excited nitrogen-oxygen species.

BACKGROUND OF THE INVENTION

For many years, silicon dioxide ($SiO_2$) has been used in semiconductor substrates for components such as transistor gate dielectrics and capacitor dielectrics. However, as circuit components have reduced in size, the electrical performance characteristics of $SiO_2$ results in undesirable effects such as increased leakage current. Controlling leakage current to maintain high speed and low power performance presents a challenge when older-generation dielectrics such as $SiO_2$ are used in the fabrication of newer integrated circuit geometries.

Newer processes, especially those that use fabrication geometries less than 65 nm have begun to include high dielectric constant ("high-k") insulators in semiconductor fabrication. Some chipmakers now rely on high-k dielectrics, especially for 45 nm and smaller process geometries. Replacing $SiO_2$ gate dielectrics with high-k dielectrics is important to achieve smaller device geometries while controlling leakage and other electrical performance criteria.

While the use of high-k dielectrics allows for smaller scaling of integrated circuit components such as transistor gate dielectrics, challenges arise in their fabrication. Certain metal and rare earth oxides such as zirconium oxide, titanium oxide, hafnium oxide, tantalum oxide, aluminum oxide, yttrium oxide, and lanthanum oxide are known to provide desirable characteristics when deposited as thin films yet present challenges during the fabrication process such as incompatibilities between process chemistries, extended deposition cycle times, and less than desired deposition uniformity.

A wide variety of methods and related apparatus exist to provide a thin film on a substrate such as a semiconductor. Some methods form a thin film on a substrate by utilizing a surface reaction on the semiconductor, such as vacuum evaporation deposition, molecular beam epitaxy, different variants of Chemical Vapor Deposition (CVD) (including low-pressure CVD, organometallic CVD and plasma-enhanced CVD) and Atomic Layer Epitaxy (ALE). ALE is also referred to as Atomic Layer Deposition (ALD).

ALD is a method of depositing thin films on a surface of a substrate through the sequential introduction of various precursor species. A conventional ALD apparatus may include a reaction chamber including a reactor and substrate holder, a gas flow system including gas inlets for providing precursors and reactants to a substrate surface and an exhaust system for removing used gases. The growth mechanism relies on the adsorption of a precursor on the active sites of the substrate and conditions are preferably maintained such that no more than a monolayer forms on the substrate, thereby self-terminating the process. Exposing the substrate to a first precursor is usually followed by a purging stage or other removal process (e.g., an evacuation or "pump down") wherein any excess amounts of the first precursor as well as any reaction by-products are removed from the reaction chamber. The second reactant or precursor is then introduced into the reaction chamber at which time it reacts with the first precursor, and this reaction creates the desired thin film on the substrate. The reaction terminates when all of the available first precursor species adsorbed on the substrate has been reacted with the second precursor. A second purge or other removal stage is then performed which rids the reaction chamber of any remaining second precursor and possible reaction by-products. This cycle can be repeated to grow the film to a desired thickness.

One of the recognized advantages of ALD over other deposition processes is that it is self-saturating and uniform, as long as the temperature is within the ALD window (which is above the condensation temperature and below the thermal decomposition temperature of the reactants) and sufficient reactant is provided to saturate the surface in each pulse. Thus, neither temperature nor gas supply needs to be perfectly uniform in order to obtain uniform deposition.

ALD is further described in Finnish patent publications 52,359 and 57,975 and in U.S. Pat. Nos. 4,058,430 and 4,389, 973. Apparatus for implementing these methods are disclosed in U.S. Pat. Nos. 5,855,680, 6,511,539, and 6,820,570, Finnish Patent No. 100,409, Material Science Report 4(7)(1989), p. 261, and Tyhjiotekniikka (Finnish publication for vacuum techniques), ISBN 951-794-422-5, pp. 253-261.

Different film materials have been deposited employing ALD. Known materials for use in ALD include binary oxides such as $Al_2O_3$, $HfO_2$, $ZrO_2$, $La_2O_3$ and $Ta_2O_5$. Various ternary oxides are also well known materials for use in ALD and include HfZrO, HfAlO and HfLaO. As discussed previously, selection of the appropriate material for use in high-k dielectric applications requires consideration of the impact of the deposited substance on the particular substrate and circuit environment, as well as considerations over process chemistry. In the case of ALD of HfLaO, a known Hf-precursor is $HfCl_4$ and a known La-precursor is $La(THD)_3$. Due to the hygroscopic nature of $La_2O_3$, ozone ($O_3$) is often used instead of $H_2O$ as an oxidant in prior art processes, but unfortunately, both the $HfCl_4/O_3$ process and the $La(THD)/O_3$ process are highly sensitive to even small changes in the ozone present. In some instances, use of ozone also results in less than desired uniformity of the deposited oxide film. Further, managing two different oxidation chemistries complicates the deposition process when it is desirable that a single oxidizer (such as ozone) could be used in a manner to obtain efficient and consistent deposition results, regardless of the type of metal precursor being used in the deposition process.

Plasma discharges can be used to excite gases to produce activated gases containing ions, free radicals, atoms and molecules. Activated gases are used for numerous industrial and scientific applications including processing solid materials such as semiconductor wafers, powders, and other gases. The parameters of the plasma and the conditions of the exposure of the plasma to the material being processed vary widely depending on the application.

Plasmas can be generated in various ways including current discharge, radio frequency (RF) discharge, and microwave discharge. Current discharges are achieved by applying a potential between two electrodes in a gas. RF discharges are achieved either by electrostatically or inductively coupling energy from a power supply into a plasma. Parallel plates are typically used for electrostatically coupling energy into plasma. Induction coils are typically used for inducing current into the plasma. Microwave discharges are achieved by directly coupling microwave energy through a microwave-passing window into a discharge chamber containing a gas. Microwave discharges are advantageous because they can be used to support a wide range of discharge conditions, including highly ionized electron cyclotron resonant (ECR) plasmas.

ALD systems have used plasma-based approaches to create oxidant gasses such as ozone. In one common configuration, Dielectric Barrier Discharge (DBD) ozone generators create ozone ($O_3$) from oxygen ($O_2$) that is provided as a feedgas to a corona discharge source. Referring to FIG. 5, a simplified DBD ozone generator cell 500 is illustrated. Typically, dry feedgas oxygen 530 is passed through a gap 505 formed between electrodes 510A, 510B, which are in turn energized by a high voltage source such as an alternating current (AC) voltage source 560. The voltage produced by the source 560 can reach several thousand volts, depending on the configuration of the generator. Alternatively one of the electrodes may be at ground potential, and the other electrode energized to a high voltage. A dielectric material 520A, 520B, is interposed between the energized electrodes 510A, 510B and the feedgas 530. When high voltage at low or high frequencies is applied to the electrodes 510A, 510B, ozone 550 is produced in the feedgas by micro-discharges taking place in the gap 505 and distributed across the dielectric 520A, 520B. The geometry of the gap and the quality of the dielectric material vary by the ozone generator manufacturer. Of note, DBD devices can be fabricated in many configurations, typically planar, using parallel plates separated by a dielectric or in a cylindrical form, using coaxial plates with a dielectric tube between them. In a common coaxial configuration, the dielectric is shaped in the same form as common fluorescent tubing. It is filled at atmospheric pressure with either a rare gas or rare gas-halide mix, with the glass walls acting as the dielectric barrier. Common dielectric materials include glass, quartz, ceramics and polymers. The gap distance between electrodes varies considerably, from 0.1 mm to several cm, depending on the application. The composition of the feed gas is also an important factor in the operation of the ozone generator.

High-performance ozone generators that use the DBD principle require nitrogen in the feed gas to obtain optimum performance and consistent ozone generation. The formation of ozone involves a reaction between an oxygen atom, an oxygen molecule and a collision partner such as $O_2$, $N_2$ or possibly other molecules. If the collision partner is nitrogen, the nitrogen molecules are able to transfer their excitation energy, after impact, to the oxygen molecules resulting in dissociation. Some of the excited nitrogen radicals that are formed may also dissociate oxygen or react with nitrogen oxides to liberate oxygen atoms. Many different forms of nitrogen-oxygen compounds may be produced during the process—NO, $NO_2$, $N_2O$, and $N_2O_5$, have been measured in the output DBD-type ozone generators. Some manufacturers have focused efforts to reduce or eliminate altogether the presence of certain N—O species from the output ozone stream of their ozone generators, as in some instances, aggressive corrosion of gas lines and welds from N—O compounds in the ozone stream may occur. In conventional ozone generators, control over the presence and type of N—O compounds in the output stream of ozone generators is lacking, and a need exists to be able to monitor and/or actively control the formation and generation of such compounds.

Thus, a need exists for a method for depositing a dielectric film on a substrate with reduced throughput times and with enhanced deposition uniformity. What is also needed is a system to monitor and/or control nitrogen-oxygen compounds created in an oxidizer generator such as an ozone generator.

BRIEF DESCRIPTION OF ILLUSTRATIVE EMBODIMENTS OF INVENTION

One embodiment of the invention includes methods and systems for depositing a metal oxide film such as a hafnium oxide ($HfO_2$), zirconium oxide ($ZrO_2$), lanthanum oxide ($La_2O_3$) and/or tantalum oxide ($Ta_2O_5$) on a substrate with enhanced deposition efficiency and uniformity. Some embodiments utilize an ALD system in combination with various precursors as explained below in combination with molecular and excited nitrogen-oxygen radical/ionic species (hereinafter referred to as "NxOy species," where "x" and "y" may constitute any appropriate integers, and which may include excited species such as NO* and $N_2O$*) in possible further combination with oxidizers such as ozone. Embodiments of the invention may also include electronic components and systems that include devices fabricated with methods consistent with the present invention.

Ozone ($O_3$) is a commonly used oxidant in ALD of various high-k metal oxides. Commercially available ozone delivery systems commonly rely on the dielectric barrier discharge and often utilize nitrogen in the feed gas to provide consistent ozone generation. Through a series of plasma reactions, various $N_xO_y$ species can also form within the corona from $O_2$ in the presence of $N_2$. These species, while present in various concentrations in the generator effluent, are unregulated by the delivery system which measures and actively controls the $O_3$ concentration only.

Several ALD processes using ozone are extremely sensitive to the conditions of ozone generation. For example, a wide response in $HfO_2$ deposition rate and film uniformity was observed as a function of $O_2$:$N_2$ feed gas ratio and reactor temperature in a cross-flow, thermal ALD reactor $HfCl_4$/$O_3$ ALD (using pure $O_3$) has a process window at low reactor temperature (200-250° C.). At higher temperatures (e.g., 300° C.), uniform $HfO_2$ layers were obtained when N2 was added during $O_3$ generation. This indicates that the reactive species in ozone based ALD may not be exclusively $O_3$, but at 300° C. $N_xO_y$ species may contribute as well.

Therefore, a study was conducted to first characterize the gaseous species entering (from ozone delivery system) and exiting the ALD reactor as a function of $O_2:N_2$ feed gas ratio, $O_3$ concentration, and generator power levels using FTIR. $N_2O_5$ and $N_2O$ were detected at the outlet of the $O_3$ delivery unit with $N_2/O_2$ feed gas. The lifetime of $O_3$ and the $N_xO_y$ species were investigated as a function of the reactor temperature and material of coating ($HfO_2$, $Al_2O_3$, etc.). FTIR analysis of the reactor effluent during the ozone half-reaction with adsorbed $HfO_2$—$HfCl_3$ was employed to elucidate the role of $N_xO_y$ species on $HfO_2$ deposition. ALD deposition rates, film uniformities, and various bulk and electrical film properties for $HfO_2$ deposited under various ozone delivery conditions, and based on FTIR, and theories surrounding the role of $O_3$ and $N_xO_y$ species on potential reaction paths were determined.

During experiments conducted in ALD deposition of thin film metal oxides using metal halide precursor/ozone oxidizer chemistry, it was observed that no growth was taking place on a substrate when the substrate was exposed to an ozone oxidizer that had been generated by using pure oxygen feed gas. However, when gaseous nitrogen was added to the oxygen stream in the ozone generator, as is commonly the practice to increase efficiency of ozone generation, layer growth was observed during the ALD deposition process. For example, in various trials using ozone generated from pure oxygen, no uniform $HfO_2$ or $ZrO_2$ layers could be deposited at 300° C., but when ozone was generated from oxygen/nitrogen feed gas, uniform layers could be deposited. Different trials also showed that the growth rate and uniformity is dependent upon the amount of nitrogen used in the ozone generator relative to the amount of oxygen feed gas.

It was further determined by experimentation that the concentration of $N_2$ feed gas used for the generation of ozone influences the deposition process. In one such trial, where 0 ppm of $N_2$ showed little uniform growth, 40 ppm of $N_2$ resulted in an increased growth, and when $N_2$ was adjusted to 400 ppm, significant uniform growth occurred. Additional experiments were then undertaken as depicted in FIGS. 10-11, using an $O_2$ flow in the ozone generator of 2.5 slm, 18 wt %, with close loop control, with varying concentrations of nitrogen shown in the charts. Ozone injection flow into the reaction chamber was 1200 sccm. The $HfCl_4$ precursor was pulsed into the chamber for 3 seconds followed by a 3 second purge, and the gas obtained from the ozone generator was then pulsed into the reaction chamber for 10 seconds followed by a 10 second purge. As a result, growth rate of the deposited metal oxide layer began to increase immediately when nitrogen concentration was increased, and reached a first peak when nitrogen concentration reached about 110 ppm (as seen in the close-up view of FIG. 10, which represents the left most portion of the graph in FIG. 11) and gently started declining as nitrogen concentrations were further increased. Likewise, uniformity (NU %) was improved and reached its best values at about 110 ppm of nitrogen concentration. FIG. 11 shows an additional impact when $N_2$ concentration was increased; first, thickness fell and uniformity decreased up to the range of about 4000 ppm of $N_2$, but then the trend reversed itself as the $N_2$ concentration increased, significantly flattening out around 24000 ppm of $N_2$. Depending on the desired effect on the growth rate and uniformity of the deposited layer, a concentration of $N_2$ may be adjusted to achieve the desired effect. FIG. 12 shows a different view of the process using similar $HfCl_4$ precursor and process parameters, but shows growth rate and uniformity as a function of the flow rate of $N_2$ feed gas supplied to the ozone generator. As can be seen in the graph, increasing the flow of $N_2$ produced a substantial increase in growth rate and improvement in uniformity of the deposited hafnium oxide layer.

Experiments with other ALD precursor chemistries also demonstrated an improvement in deposition of metal oxides when nitrogen feed gas concentrations were increased in the ozone generator. FIG. 13 illustrates a chart showing improvements of the thickness and uniformity (NU %) of a deposited lanthanum oxide film in an ALD process as the amount of nitrogen feed gas supplied to the ozone generator is increased. The precursor used in this case was the rare earth cyclopentadienyl (Cp) compound $La(iPrCp)_3$.

Additional tests were undertaken to determine whether the strong oxidant $N_2O$, when used alone as an oxidizer gas in ALD processes, would cause metal oxide layer growth with $HfCl_4$ and TMA precursor chemistries. The $N_2O$ gas was furnished not from an ozone generation-type device but from a cylinder, and regardless of temperatures used during the ALD process, no growth was observed in this configuration. The active N—O compounds formed during ozone generation, however, were effective in producing uniform layer growth as described above.

It was determined that various nitrogen compounds originating from exposure of oxygen and nitrogen to a plasma source result in active compounds that enhance growth rate and uniformity of thin film deposition processes. Some embodiments of the invention may utilize nitrogen and oxygen compounds, particularly excited N—O species obtained from exposure of the component gasses to a plasma source, to obtain uniform growth of metal oxide layers in ALD processes. Those of skill in the relevant arts also appreciate that use of excited N—O species may also be used in other types of deposition processes described above.

In one embodiment, methods and systems of the invention utilize an activated gas containing ions and active species of nitrogen-oxygen compounds in the form of free radicals (referred to herein as active $N_xO_y$ species, where "x" and "y" may comprise any appropriate integers) to enhance deposition of thin film metal oxides including rare earth oxides. After a substrate has been exposed to an ALD precursor pulse/purge cycle in the reactor, the ions/free radicals in the gas are introduced into a reactor with a substrate during an oxidation pulse, with or without an additional oxidizer such as ozone. The introduced gasses are allowed to contact a material to be treated, whereby a desired reaction occurs. In one embodiment, an organo-metallic or metal halide-containing layer of deposited material is oxidized by introduction of the activated $N_xO_y$ species with or without an additional oxidizer.

As used herein, "substrate" refers to any surface upon which film processing is performed. For example, a substrate on which processing can be performed, can be comprised of materials such as silicon, silicon oxide, silicon on insulator (SOI), carbon doped silicon oxides, silicon nitride, doped silicon, germanium, gallium arsenide, glass, sapphire, or any other suitable materials such as metals, metal nitrides, metal alloys, or other conductive materials, printed organic or inorganic circuit boards, or thin-film ceramic substrates, depending on the application. In an example embodiment, the substrate comprises a semiconductor. Barrier layers, metals or metal nitrides on a substrate surface include titanium, titanium nitride, tungsten nitride, tantalum and tantalum nitride. Substrates may have any desired dimensions, such as 200 mm or 300 mm diameter wafers, and may also take the form of rectangular or square panels.

As used herein, "pulse" refers to an introduction of a quantity of a compound that is intermittently or non-continuously introduced into a reaction zone of a reaction chamber. The quantity of a particular compound within each pulse may vary over time, depending on the duration of the pulse. As more fully explained below, the duration of each pulse is selected depending upon a number of factors such as, for example, the volume capacity of the process chamber employed, the vacuum system coupled thereto, and the volatility/reactivity of the particular compound itself.

In one embodiment, a method is provided for depositing a film on a substrate that is situated within a reaction chamber, the method comprising applying an atomic layer deposition cycle to the substrate, the cycle comprising: exposing the substrate to a precursor gas for a precursor pulse interval then removing the precursor gas thereafter; and exposing the substrate to an oxidizer comprising an oxidant gas and a nitrogen-containing species gas for a oxidation pulse interval then removing the oxidizer thereafter. The precursor gas may include any appropriate metal, and various embodiments of the present invention include precursor gasses comprising one or more rare earth metals such as Sc, La, Ce, Pr, Nd, Sm, Eu, Gd, Th, Dy, Ho, Er, Tm, Yb, and Lu. The precursor gas may comprise any desired compound such as metallic, organo-metallic, or metal halide compounds, including, but not limited to hafnium tetrachloride ($HfCl_4$); titanium tetrachloride ($TiCl_4$); tantalum pentachloride ($TaCl_5$); tantalum pentafluoride ($TaF_5$); zirconium tetrachloride ($ZrCl_4$); rare earth betadiketonate compounds including ($La(THD)_3$) and ($Y(THD)_3$); rare earth cyclopentadienyl (Cp) compounds including $La(iPrCp)_3$; rare earth amidinate compounds including lanthanum tris-formamidinate $La(FAMD)_3$; cyclooctadienyl compounds including rare earth metals; alkylamido compounds including: tetrakis-ethyl-methylamino hafnium (TEMAHf); tetrakis (diethylamino) hafnium (($Et_2N)_4Hf$ or TDEAH); and tetrakis (dimethylamino) hafnium (($Me_2N)_4Hf$ or TDMAH); alkoxides; halide compounds of silicon; silicon tetrachloride; silicon tetrafluoride; and silicon tetraiodide.

The oxidant gas may comprise any appropriate oxidant, and may include only a nitrogen-containing species gas. The nitrogen-containing species gas may include activated ionic or radical species including at least one of $NO^*$, $N_2O^*$, $NO_2^*$, $NO_3^*$, and $N_2O_5^*$. The oxidant preferably may contain ozone in combination with one or more gasses selected from the group consisting of O, $O_2$, NO, $N_2O$, $NO_2$, $NO_3$, $N_2O_5$, $NO_x$, an $N_xO_y$ radical species $N_xO_y$ ionic species, an $N_xO_y$ molecular species, and combinations thereof. Various active concentrations of ozone may be utilized in the oxidant gas, including approximately 5 atomic percent to 25 atomic percent $O_3$. The oxidant gas may include molecular, or activated ionic or radical species that result from decomposition processes, for example but not limited to the decomposition of $N_2O_5^*$ into products such as $NO_2^*$ and $NO_3^*$.

Ozone used in some embodiments of the invention may be generated from a plasma discharge being supplied $O_2$ and a nitrogen source gas, which may include $N_2$ or any gaseous source of nitrogen such as NO, $N_2O$, $NO_2$, $NO_3$, and $N_2O_5$. The output stream of the ozone generator may include, in various embodiments, a nitrogen-containing species gas including a molecular $N_xO_y$ species and or in addition to an excited $N_xO_y$ radical or ionic species, and may comprise a mixture of two or more of $O_2$, NO, $N_2O$, $NO_2$, $NO_3$, $N_2O_5$, $NO_x$, $N_xO_y$, radicals thereof, and $O_3$, and wherein the mixture comprises approximately 5 atomic percent to 25 atomic percent $O_3$. Any desired flow ratio may be used to generate the ozone and $N_xO_y$ species, including a mix where the flow ratio of $N_2/O_2$ exceeds 0.001. For example, embodiments in which a high $N_2$ addition is desired, such as, but not limited to, depositing $HfO_2$ and/or $Ta_2O_5$, the flow ratio of $N_2/O_2$ may equal or exceed 0.072. The ratio of the oxygen and nitrogen source gas may also influence other aspects of the ALD process including a growth rate of the deposited film; film uniformity across the substrate; a dielectric constant of the deposited film; an index of refraction of the deposited film; and a molecular composition of the deposited film. The output stream may comprise a mixture of gasses that result from decomposition processes, for example but not limited to the decomposition of $N_2O_5$ into products such as $NO_2$ and $NO_3$.

Embodiments of the generator of the may be adjusted by at least controlling power input, oxygen gas input or nitrogen input. In one embodiment, a power input controls the plasma, and an amount of power delivered to the plasma determine at least one of a growth rate of the deposited film; film uniformity across the substrate; a dielectric constant of the deposited film; an index of refraction of the deposited film; and a molecular composition of the deposited film. Embodiments may include a method provided to adjust the generation of an oxidizer such as ozone by exposing $O_2$ and a nitrogen source gas to a plasma discharge; monitoring a ratio of $O_3$ and excited $N_xO_y$ species generated by the plasma discharge; and adjusting at least one of a power input to the plasma discharge, a temperature of a housing; a flow rate of the $O_2$, and a flow rate of the nitrogen source gas to achieve a predetermined criterion. The criterion may be selected to be any appropriate parameter of generator operation, including an oxidizer flow rate; an oxidant/$N_xO_y$ concentration ratio; an active $N_xO_y$ species concentration; a ratio of active $N_xO_y$ species, wherein the excited $N_xO_y$ species gas contains a plurality of excited nitrogen-oxygen compounds; and a concentration of a particular active nitrogen-oxygen compound.

Embodiments of the invention may include additional precursor pulses and oxidizer pulses in any combination. Embodiments may include exposing the substrate to a second precursor gas for a second precursor pulse interval then removing the second precursor gas thereafter; and after removing the second precursor gas, exposing the substrate to an oxidizer comprising an oxidant gas and a nitrogen-containing species gas for a oxidation pulse interval then removing the oxidizer thereafter. Generally, but not necessarily, embodiments of invention include depositing a metal oxide at least one of in any film stack using a metal halide precursor and an oxidant comprising ozone and excited nitrogen-oxygen species. The metal oxides may comprise, for example, at least one of $Al_2O_3$, $HfO_2$, $ZrO_2$, $La_2O_3$ and $Ta_2O_5$. The metal halides comprise any metal in compound combination with any halide element.

The ALD cycle may be repeated any number of times to achieve any desired goal such as a predetermined layer thickness. The number of iterations of precursor sequences per ALD cycle may also vary, as may the ratio of the number of first precursor gas sequences performed versus the number of second precursor gas sequences performed per ALD cycle.

The pulse interval for exposure of various gasses to the substrate may be chosen to satisfy any desired process criterion, such as deposited layer growth rate or cycle throughput time. In one embodiment, the first precursor pulse interval is in the range of 300 milliseconds to 5 seconds; the first oxidation pulse interval is in the range of 50 milliseconds to 10 seconds; the second precursor pulse interval is in the range of 500 ms to 10 seconds; and the first oxidation pulse interval is in the range of 50 milliseconds to 10 seconds. In an example embodiment, the first precursor pulse interval is in the range of 1 second to 2 seconds; the first oxidation pulse interval is in the range of 50 milliseconds to 2 seconds; the second precursor pulse interval is in the range of 1 second to 4 seconds; and the first oxidation pulse interval is in the range of 50 milliseconds to 2 seconds.

Gasses and reaction byproducts may be removed from the reaction chamber using any desired technique. In one instance, the method of removing the precursor gas and oxidizer gas comprises introducing a purge gas into the reaction chamber for a predetermined purge period, wherein the purge gas comprises at least one of argon, nitrogen, helium, hydrogen, forming gas, krypton, and xenon; and the purge period may be selected to be in the range of approximately 3 seconds to 10 seconds. In an alternative embodiment, the purge period is within the range of 500 milliseconds to four seconds. In one implementation, the method of removing one or more of the precursor gas and the oxidizer gas could comprise evacuating gas from the reaction chamber for a predetermined evacuation period.

Electronic devices may be fabricated by methods consistent with embodiments of the present invention. Such devices include capacitors, transistors, a FLASH memory cells, and a DRAM memory cells, whether created as discrete components or formed within a semiconductor or other substrate. The electronic devices may comprise a metal oxide dielectric layer and a conductive layer in communication with the dielectric layer, the dielectric layer being deposited in a film by applying an ALD cycle to the substrate in the manner described herein.

There is also presented as described more fully below a system comprising: a reaction chamber; a precursor reactant source coupled to the reactor chamber; a purge gas source coupled to the reactor chamber; an oxidant source coupled to the reactor chamber; an excited nitrogen species source coupled to the reactor chamber; and a system operation and control mechanism wherein the system is configured to perform the steps of any method described herein. It is to be understood that the descriptions of this invention herein are exemplary and explanatory only and are not restrictive of the invention as claimed.

DETAILED DESCRIPTION OF EXAMPLE EMBODIMENTS

Figure 1:
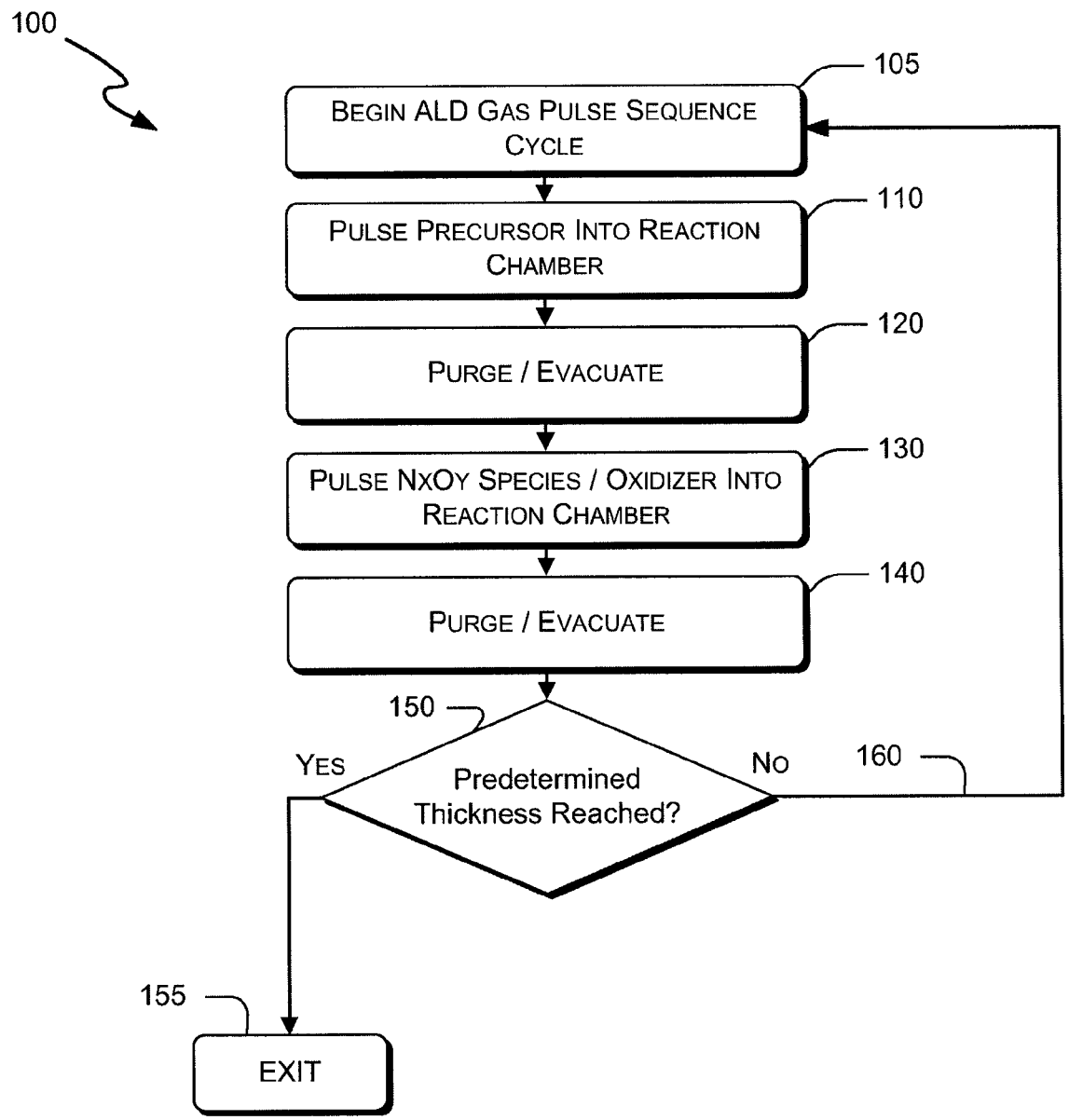
FIG. 1 illustrates a process flow for an example embodiment of the present invention.

Reference will now be made in detail to the present exemplary embodiments of the invention, examples of which are illustrated in the accompanying drawings.

Some embodiments of the invention provide methods for preparing thin films used in a variety of applications, especially for depositing high-k dielectric materials and barrier materials used in transistor, capacitor, and memory cell fabrication. Some embodiments may include the use of an atomic layer deposition (ALD) process to deposit a metal oxide thin film layer on a substrate.

The material deposited in a film during ALD deposition may be any desired material such as a dielectric material, a barrier material, a conductive material, a nucleation/seed material or an adhesion material. In one embodiment, the deposited material may be a dielectric material containing oxygen and at least one additional element, such as lanthanum, hafnium, silicon, tantalum, titanium, aluminum, zirconium, or combinations thereof, and in an example embodiment, the deposited material comprises a metal oxide, and more particularly a rare earth metal oxide. In additional embodiments, the dielectric material may contain hafnium oxide, zirconium oxide, tantalum oxide, aluminum oxide, lanthanum oxide, titanium oxide, silicon oxide, silicon nitride, oxynitrides thereof (e.g., $HfO_xN_y$), silicates thereof (e.g., $HfSi_xO_y$), aluminates thereof (e.g., $HfAl_xO_y$), silicon oxynitrides thereof (e.g., $HfSi_xO_yN_z$), and combinations thereof. The dielectric material may also contain multiple layers of varying compositions. For example, a laminate film may be formed by depositing a silicon oxide layer onto a hafnium lanthanum oxide layer to form a hafnium lanthanum silicate material.

In one embodiment, methods and systems of the present invention utilize an activated gas containing ions and active species of nitrogen-oxygen compounds in the form of free radicals (hereinafter referred to as active NxOy species) to enhance deposition of thin film metal oxides including rare earth oxides. In an embodiment, the NxOy species are presented to a substrate during a pulse of an ALD process following a metal precursor pulse, possibly with an oxidizer such as ozone.

Commercially available ozone delivery systems such as those utilized in conjunction with ALD processes commonly rely on the dielectric barrier discharge and often utilize nitrogen in the feed gas to provide consistent ozone generation. Through a complex series of plasma reactions, various NxOy species can also form within the corona from $O_2$ in the presence of $N_2$. These species, while present in various concentrations in the generator effluent, are unregulated by the delivery system which measures and actively controls the $O_3$ concentration only.

Several ALD processes using ozone are extremely sensitive to the conditions of ozone generation. For example, a wide response in $HfO_2$ deposition rate and film uniformity has been experimentally observed as a function of $O_2:N_2$ feed gas ratio and reactor temperature in a cross-flow, thermal ALD reactor $HfCl_4/O_3$ ALD (using pure $O_3$) has a process window at low reactor temperature (200-250° C.). At higher temperatures (e.g., 300° C.), uniform $HfO_2$ layers were experimentally obtained when $N_2$ was added during $O_3$ generation. These experimental results support a hypothesis that the reactive species in ozone-based ALD may not be exclusively $O_3$, but at 300° C. NxOy species contribute as well.

Therefore, studies were conducted to first characterize the gaseous species entering (from ozone delivery system) and exiting the ALD reactor as a function of $O_2:N_2$ feed gas ratio, $O_3$ concentration, and generator power levels using FTIR. $N_2O_5$ and $N_2O$ are detected at the outlet of the $O_3$ delivery unit with $N_2:O_2$ feed gas. The lifetime of $O_3$ and the NxOy species were investigated as a function of the reactor temperature and material of coating ($HfO_2$, $AhO_3$, etc.). FTIR analysis of the reactor effluent during the ozone half-reaction with adsorbed $HfO_2$-HfCh was employed to elucidate the role of NxOy species on $HfO_2$ deposition. ALD deposition rates, film uniformities, and various bulk and electrical film properties for $HfO_2$ deposited under various ozone delivery conditions, and based on FTIR, and theories surrounding the role of $O_3$ and NxOy species on potential reaction paths are were determined. As a result, some embodiments of the present invention include improved ALD deposition in layer thickness and consistency when using various molecular and excited NxOy species that were introduced to the reaction chamber as an additional output from ozone generation.

Referring to FIG. 1, a method 100 for depositing a thin metal oxide film using activated gas compounds such as NxOy species is presented. At the beginning (105) of the process 100, a substrate is located within a reaction chamber, and heated to a predetermined temperature. The predetermined temperature may comprise any desired temperature, and some embodiments of the present invention may include temperatures such as about 130° C. to 300° C. During execution of the process 100, the reaction chamber is maintained at any desired pressure range such as from about 1 mTorr to about 200 Ton, and in an example embodiment of the present invention from about 2 Torr to 6 Torr, and in another embodiment, from about 3 Torr to 4 Torr, and in yet another example embodiment the reaction chamber pressure is maintained at about 3.5 Torr.

A carrier gas may be continually or intermittently admitted into the reaction chamber, and may be utilized to distribute precursor products, reaction products, and oxidation products or to purge remaining gasses or reaction byproducts from the reaction chamber. Suitable carrier gases or purge gases may include argon, nitrogen, helium, hydrogen, forming gas, or combinations thereof.

After the ALD process is initiated (105), a precursor gas is pulsed (110) into a reaction chamber with or without a carrier gas. The precursor gas may comprise any desired compound such as metallic, organo-metallic, or metal halide compounds, including, but not limited to hafnium tetrachloride ($HfCl_4$); titanium tetrachloride ($TiCl_4$); tantalum pentachloride ($TaCl_5$); tantalum pentafluoride ($TaF_5$); zirconium tetrachloride ($ZrCl_4$); rare earth betadiketonate compounds including $(La(THD)_3)$ and $(Y(THD)_3)$; rare earth cyclopentadienyl (Cp) compounds including $La(iPrCp)_3$; rare earth amidinate compounds including lanthanum tris-formamidinate $La(FAMD)_3$; cyclooctadienyl compounds including rare earth metals; alkylamido compounds including: tetrakis-ethyl-methylamino hafnium (TEMAHf); tetrakis (diethylamino) hafnium (($Et_2N)_4Hf$ or TDEAH); and tetrakis (dimethylamino) hafnium (($Me_2N)_4Hf$ or TDMAH); alkoxides; halide compounds of silicon; silicon tetrachloride; silicon tetrafluoride; and silicon tetraiodide.

During the gas pulses as referred to herein, the substrate in the reaction chamber is exposed to the admitted gas for a predetermined period of time, and this period of time is herein referred to as a pulse interval. The pulse interval for the presentation of the precursor gas to the substrate may be predetermined to be any desired time, and for example may include a time in the range of approximately 300 milliseconds to 5 seconds, and in one embodiment the pulse interval is in the range of 1 second to 3 seconds.

After the substrate has been exposed to the precursor gas for a predetermined pulse interval, the precursor gas is purged (120) from the reaction chamber by admission of a purge gas and/or by evacuation or pumping. Purging time, or the time during which a purging gas is admitted to the reaction chamber to displace and/or remove other gasses or reaction products, may be selected to be any desired time such as approximately 3 to 10 seconds, and may in some embodiments be approximately 500 milliseconds to 5 seconds.

An activated NxOy species gas as defined above is introduced (130) to the reaction chamber, and in one embodiment, a layer of precursor material deposited in step (110) is oxidized by introduction of the activated NxOy species with or without an additional oxidizer. During this step (130) an oxidizer/oxidant gas or combination of oxidizer/oxidant gasses may be admitted concurrently or sequentially into the reaction chamber to react with the first precursor. The NxOy species gas may also be introduced with or without a carrier gas such as nitrogen $N_2$, and further in possible combination with an oxidant gas or mixture of oxidant gasses. As mentioned previously, the NxOy species may comprise any activated, ionic or radical N—O compound such as activated nitrous oxide ($N_2O^*$), nitric oxide ($NO^*$), dinitrogen pentoxide ($N_2O_5^*$), or nitrogen dioxide ($NO_2^*$). The NxOy species gas may be generated in any desired manner, and in one embodiment, the NxOy species are created by plasma discharge from an ozone generator being supplied $O_2$, $N_2$, $N_2O$, NO, $NH_3$ or any nitrogen bearing molecule wherein concentration of nitrogen bearing molecule is greater than 5 sccm/2000 sccm or 2000 ppm. In another embodiment, the NxOy species are created within or supplied to the reaction chamber by remote or direct plasma methods such as inductively coupled, ECR (electron cyclotron resonance), capacitively coupled methods, with any desired feedgas. In yet another embodiment, NxOy species are created by feeding a nitrogen-oxygen gas such as NO or $N_2O$ into a coronal discharge (such as provided by an ozone generator) (or alternatively a remote or direct plasma source) with no additional oxygen. Additional $N_2$ may be provided to the coronal discharge or plasma source along with the nitrogen-oxygen gasses. In yet another embodiment, a stoichiometric amount of $N_2+O_2$ is provided to a coronal discharge or plasma source to produce NxOy* (e.g., NO radicals).

Any desired oxidizing gas may be used in any step in the present ALD process, and such oxidizing gas may include oxygen ($O_2$), ozone ($O_3$), atomic-oxygen (0), water ($H_2O$), hydrogen peroxide ($H_2O_2$), nitrous oxide ($N_2O$), nitric oxide (NO), dinitrogen pentoxide ($N_2O_5$), nitrogen dioxide ($NO_2$), derivatives thereof or combinations thereof. In an example embodiment, the oxidizing gas is an ozone/oxygen ($O_3/O_2$) mixture, such that the ozone is at a concentration within a range from about 5 atomic percent $O_3$ of the $O_3/O_2$ mixture to about 25 atomic percent $O_3$. In one embodiment where the NxOy species is introduced concurrently with an oxidant gas such as an ozone/oxygen ($O_3/O_2$) mixture, the NxOy species may represent greater than 1% of oxidizing flow stream by volume. In an alternate embodiment, the oxidant gas added to the NxOy species gas is an ozone/oxygen ($O_3/O_2$) mixture, such that the ozone is at a concentration within a range from about 12 atomic percent $O_3$ of the $O_3/O_2$ mixture to about 18 atomic percent $O_3$.

The NxOy/oxidizer step (130) continues for a predetermined pulse interval, and the duration thereof may be any appropriate time range such as approximately 50 milliseconds to 10 seconds, and in another embodiment, the first oxidation pulse interval is in the range of 50 milliseconds to 2 seconds. The NxOy gas or NxOy/oxidant gas is then purged (140) from the reaction chamber by admission of a purge gas or by evacuation or pumping. Purging time may be selected to be any suitable time such as approximately 3-10 seconds, and may in some embodiments be approximately 500 milliseconds.

Once the NxOy species gas or NxOy/oxidant gas has been purged from the reaction chamber, the process 100 of FIG. 1 continues, wherein a determination is made (150) whether to repeat (160) the sequence. Such a determination may be made based on any desired criteria. For example, it may be based upon the number of precursor gas pulse sequences required to achieve a particular concentration, thickness, and/or uniformity of a deposited substance. The determination may also be made in the case of another embodiment incorporating a plurality of precursor/purge steps before the NxOy pulse step a desired ratio of a precursors, especially in embodiment wherein multiple different precursors are applied to the substrate before exposure to the NxOy species to obtain a desired substrate such as a ternary metal oxide. For example, in any order, a lanthanum-containing precursor could be used in one precursor pulse and a hafnium-containing precursor in another precursor pulse producing an HfLaO oxide layer after an NxOy pulse step. The process 100 iterates (160) until the predetermined criteria are satisfied, whereupon, the process terminates (155).

Figure 2:
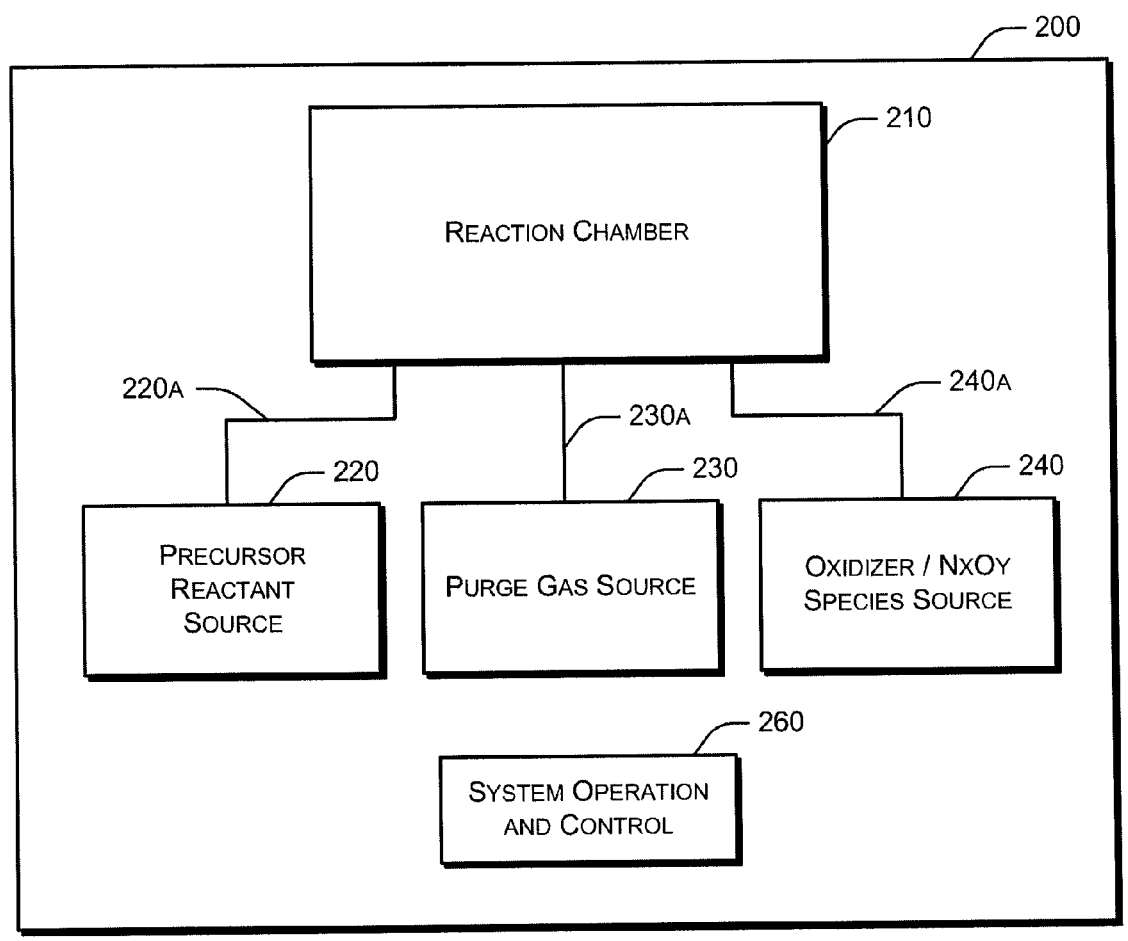
FIG. 2 shows a schematic illustration of a thin film processing system according to an example embodiment of the present invention.

FIG. 2 schematically illustrates an embodiment of a thin film processing system 200 including a reaction chamber that further includes mechanism for retaining a substrate (not shown) under predetermined pressure, temperature, and ambient conditions, and for selectively exposing the substrate to various gasses. A precursor reactant source 220 is coupled by conduits or other appropriate means 220A to the reaction chamber, and may further couple to a manifold, valve control system, mass flow control system, or other mechanism to control a gaseous precursor originating from the precursor reactant source 220. A precursor (not shown) supplied by the precursor reactant source 220 the reactant (not shown) may be liquid or solid under room temperature and standard atmospheric pressure conditions. Such a precursor may be vaporized within a reactant source vacuum vessel, which may be maintained at or above a vaporizing temperature within a precursor source chamber. In such embodiments, the vaporized precursor may be transported with a carrier gas (e.g., an inactive or inert gas) and then fed into the reaction chamber 210 through conduit 220A. In other embodiments, the precursor may be a vapor under standard conditions. In such embodiments, the precursor does not need to be vaporized and may not require a carrier gas. For example, in one embodiment the precursor may be stored in a gas cylinder.

A purge gas source 230 is also coupled to the reaction chamber 210, and selectively supplies various inert or noble gasses to the reaction chamber 210 to assist with removal of precursor gasses, oxidizer gasses, NxOy species gasses or waste gasses from the reaction chamber. The various inert or noble gasses that may be supplied may originate from a solid, liquid, or stored gaseous form. An oxidizer/NxOy species source 240 is coupled 240A to the reaction chamber 210, again through conduits or other appropriate means 220A to the reaction chamber, and may further couple to a manifold, valve control system, mass flow control system, or other mechanism to control a gaseous oxidizer/NxOy species gas originating from the precursor reactant source 220.

Figure 4:
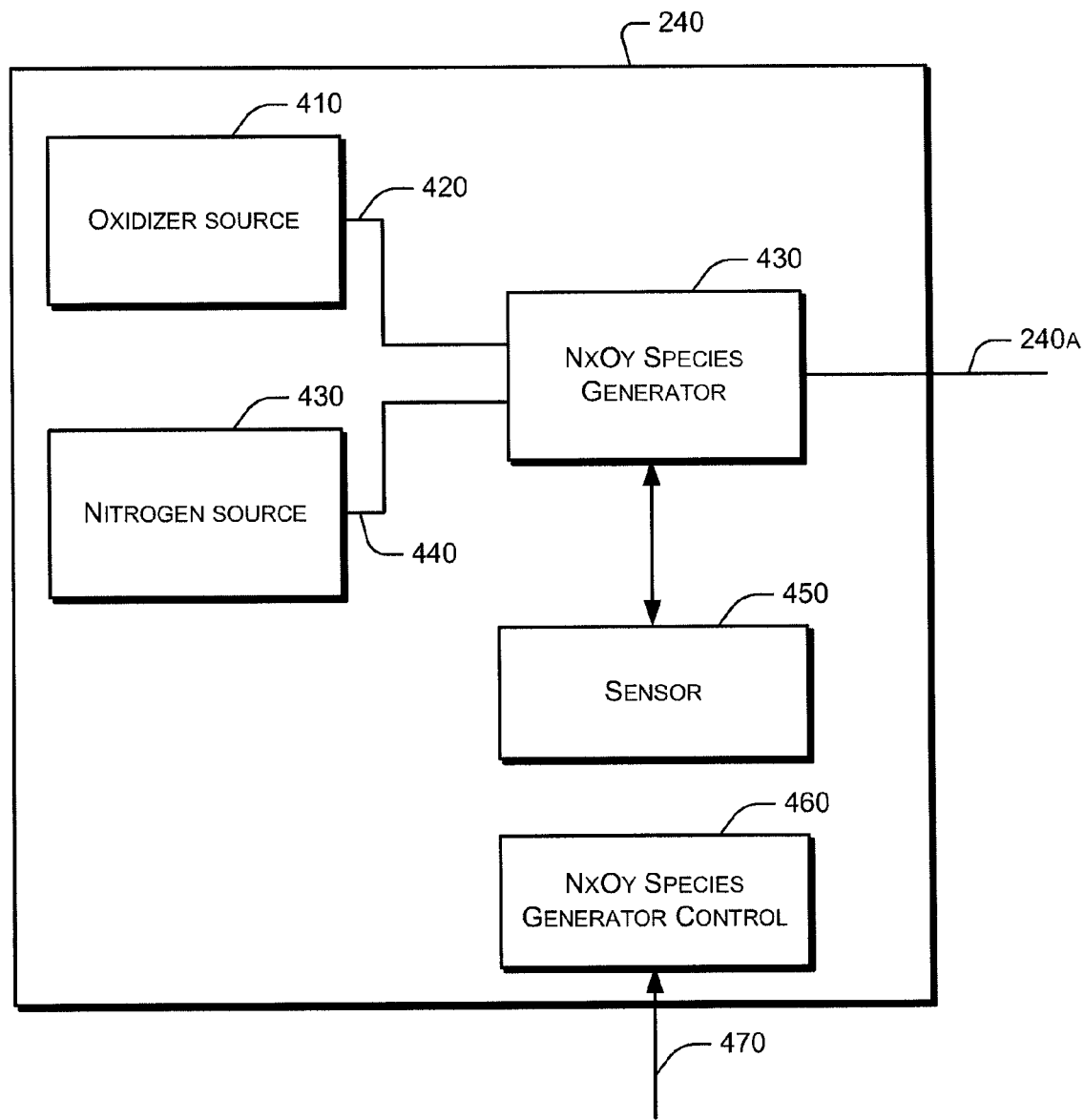
FIG. 4 illustrates one example embodiment of the oxidizer/NxOy species source of the present invention.
Figure 5:
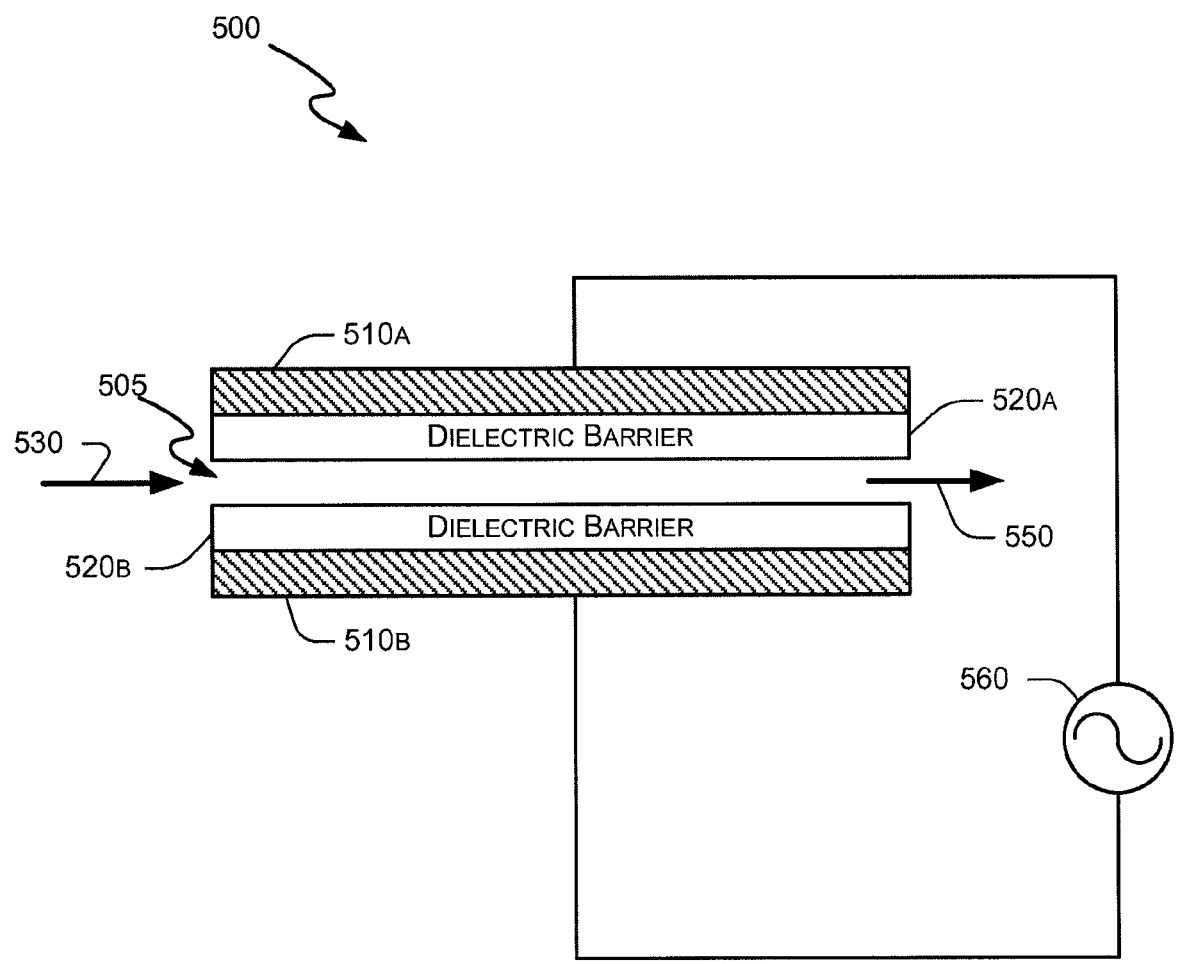
FIG. 5 illustrates a simplified DBD ozone generator cell of the prior art.

The oxidizer/NxOy species source 240 generates ozone and NxOy species through any desired mechanism and any desired feedgasses including conventional ozone generators, direct or remote plasma generators, or the like. FIG. 4 illustrates one embodiment of the oxidizer/NxOy species source 240 of the present invention, wherein an output stream 240A including NxOy species is created by plasma discharge from a generator 430 being supplied an oxidizer such as $O_2$ from an oxidizer source 410 coupled 420 to the generator 430, and a nitrogen source 430 coupled 440 to the generator 430 and supplying $N_2$, $N_2O$, NO, $NH_3$ or any nitrogen bearing molecule. The generator 430 may further comprise an ozone generator such as a DBD generator, or a generator utilizing any remote or direct plasma activation method such as inductively coupled, ECR (electron cyclotron resonance), or capacitively coupled methods.

In alternate embodiments (not shown) NxOy species are created by feeding a nitrogen-oxygen gas such as NO or $N_2O$ into a coronal discharge in the generator 430 with no additional oxidizer. Additional $N_2$ may be provided to the generator 430 along with the nitrogen-oxygen gasses. In yet another embodiment, a stoichiometric amount of $N_2+O_2$ is provided to the generator 430 to produce NxOy* (e.g. NO radicals).

A sensor 450 may be utilized to monitor the amount, composition, and/or concentration of oxidizer and NxOy species being created by the generator 430. The sensor 450 may comprise any appropriate hardware, mechanism, or software to detect the presence of desired NxOy radical or ionic species and/or oxidizers, and may include in various embodiments, a sensor including a Fourier Transform Infrared Spectroscopy analyzer, a UV absorption sensor, a density sensor, a conductivity/permittivity sensor, a chemiluminescence sensor, or a gas chromatography sensor. The sensor 450 may be further coupled to a NxOy species generator control 460, which through various user or automated inputs 470, configures the generator 430, oxidizer source 410, nitrogen source 430, and optional carrier gas source (not shown) to produce a desired composition and volume of NxOy species and other gasses in the output stream 240A. Such other gases in some embodiments may include oxidizers such as $O_2/O_3$ in desired ratios or other gasses. For example, but not by way of limitation, the generator control 460 may modulate a power input (not shown) to the generator 430 to change the composition of the types of activated ionic or free radical N—O compounds in the gaseous output stream 240A. By virtue of the sensor's 450 coupling to the generator 430 and/or its output stream 240A, and by the control 460 being configured to receive signals from sensor 450 indicating changes in the composition and volume of the output stream 240A, closed-loop control can be implemented by software and/or electronic hardware to operate electrically- or pneumatically-controlled valves to control the flow of nitrogen source gasses, oxidizer source gasses, carrier gasses, or other gasses in addition to controlling a power and/or frequency input to the generator 430 to achieve a desired output gas composition including NxOy species.

FIG. 2 also illustrates a system operation and control mechanism 260 that provides electronic circuitry and mechanical components to selectively operate valves, manifolds, pumps, and other equipment included in the system 200. Such circuitry and components operate to introduce precursors, purge gasses, oxidizers/NxOy species from the respective precursor sources 220, purge gas source 230, and oxidizer/NxOy source to the reaction chamber 210. The system operation and control mechanism 260 also controls timing of gas pulse sequences, temperature of the substrate and reaction chamber, and pressure of the reaction chamber and various other operations necessary to provide proper operation of the system 200. The operation and control mechanism 260 can include control software and electrically or pneumatically controlled valves to control the flow of precursors, reactants, oxidizers, NxOy species, and purge gases into and out of the reaction chamber 210. In one embodiment that is particularly suited for ALD reactors, the operation and control mechanism 260 also controls the flow of the treatment gas into the reaction chamber 210 to deactivate the surface against ALD reactions, such as by forming a protective layer on an inner surface of the reaction space. After deactivating the surfaces, the control system loads substrate(s) such as silicon wafers into the chamber 210 and flows precursor, oxidizer, NxOy species, and/or purge gases into the chamber 210 to form a deposit on the substrate. The control system can include modules such as a software or hardware component, e.g., a FPGA or ASIC, which performs certain tasks. A module can advantageously be configured to reside on the addressable storage medium of the control system and be configured to execute one or more processes.

Those of skill in the relevant arts appreciate that other configurations of the present system are possible, including different number and kind of precursor reactant sources, purge gas sources, and/or oxidizer/NxOy sources. Further, such persons will also appreciate that there are many arrangements of valves, conduits, precursor sources, purge gas sources carrier gas sources, and/or oxidizer sources that may be used to accomplish the goal of selectively feeding gasses into the reactor reaction chamber 210. Further, as a schematic representation of a thin film processing system, many components have been omitted for simplicity of illustration, and such components may include, for example, various valves, manifolds, purifiers, heaters, containers, vents, and/or bypasses.

Figure 3A:
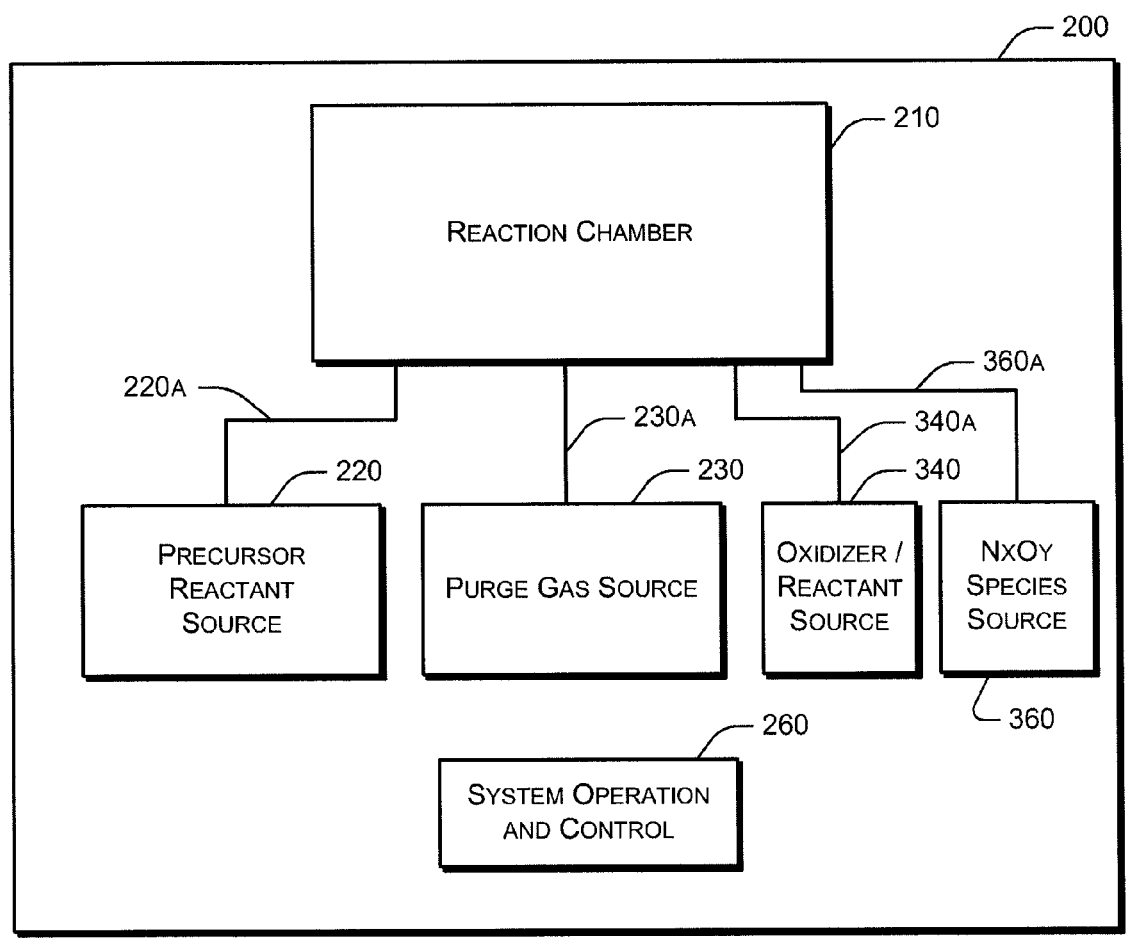
FIG. 3A shows a schematic illustration of a thin film processing system according to an example embodiment of the present invention with separated oxidizer and NxOy species sources.

FIG. 3A shows an alternative schematic implementation of the processing system 200, where a oxidizer/reactant source 340 is coupled 340A to the reaction chamber 210 separate from an NxOy species source 360 that is also coupled 360A to the reaction chamber. Through this configuration, the system operation and control 260 may introduce oxidizer or other reactants from the oxidizer reactant source 340 independently from introducing NxOy species-bearing gasses to the reaction chamber 210. Through this configuration, it may be possible to apply independent gas pulses of oxidizers, NxOy species-bearing gasses, or a combination of the two to the reaction chamber to achieve a particular layer deposition result. In one implementation, alternating pulses of oxidizer and NxOy species-bearing gasses may be applied to obtain enhanced growth rates or uniformity of metal oxide films deposited on the substrate within the reaction chamber 210.

Figure 3B:
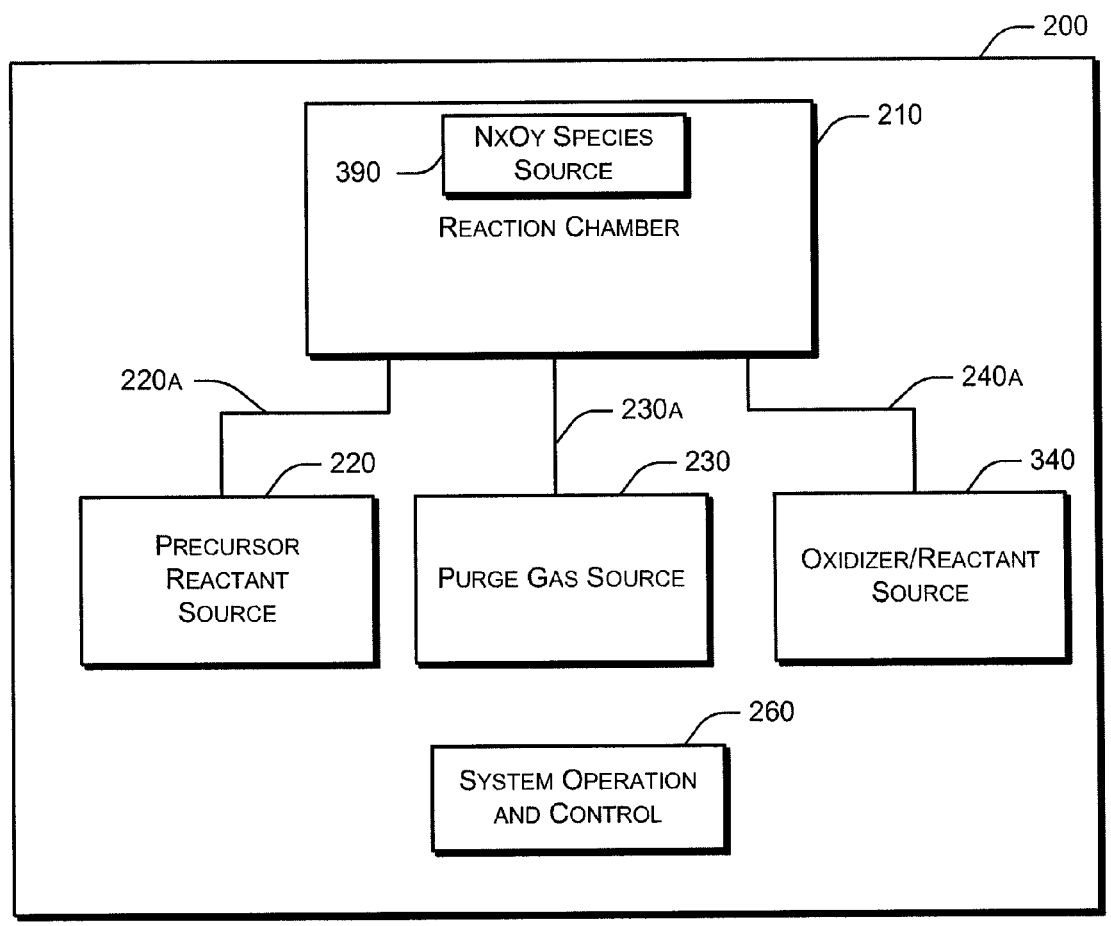
FIG. 3B shows a schematic illustration of a thin film processing system according to an example embodiment of the present invention with an NxOy species source within the reaction chamber.

FIG. 3B shows yet another schematic implementation of the processing system 200, where a oxidizer/reactant source 340 is coupled 340A to the reaction chamber 210 separate from an NxOy species source 390 that is integrated within the reaction chamber 210. Not shown are conduits and couplings that supply various source feedgasses such as oxygen- or nitrogen-bearing gasses to the NxOy species source 390, or its output connection that relays NxOy species-bearing gasses to the substrate located within the reaction chamber 210. Similarly to the illustrated of the system 200 depicted in regards to FIG. 3A, the system operation and control 260 may introduce oxidizer or other reactants from the oxidizer/reactant source 340 independently from introducing NxOy species-bearing gasses to the reaction chamber 210. Also, through this configuration, it may be possible to apply independent gas pulses of oxidizers, NxOy species-bearing gasses, or a combination of the two to the reaction chamber to achieve a particular layer deposition result. In one implementation, alternating pulses of oxidizer and NxOy species-bearing gasses may be applied to obtain enhanced growth rates or uniformity of metal oxide films deposited on the substrate within the reaction chamber 210.

Figure 6:
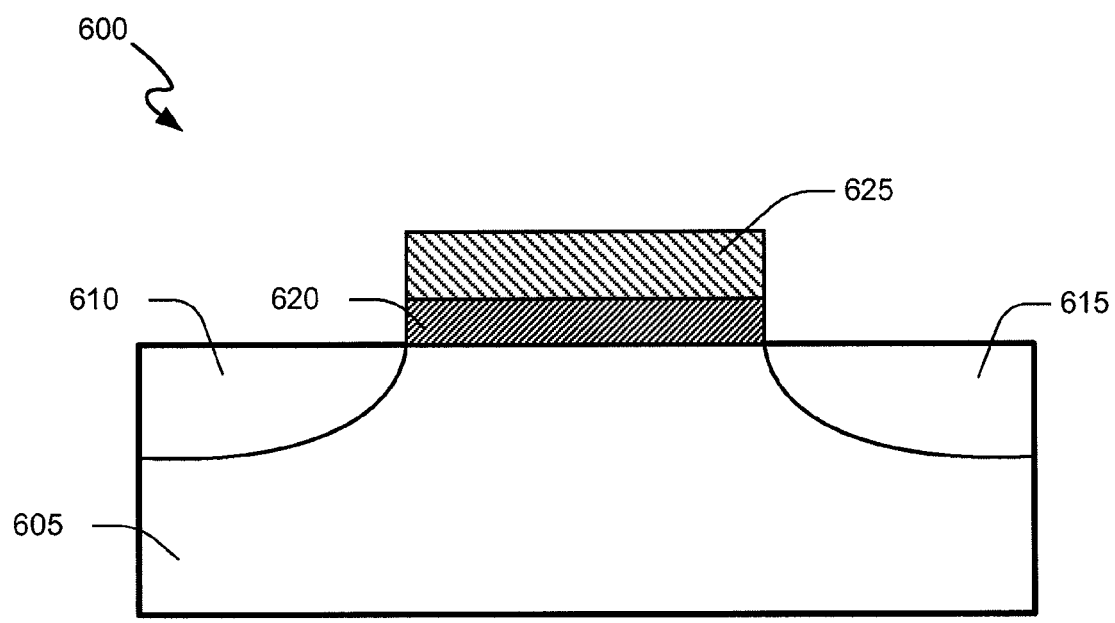
FIG. 6 depicts a metal oxide transistor with a dielectric layer formed by methods consistent with an example embodiment of the present invention

FIG. 6 illustrates a single metal oxide (MOS) transistor 600 fabricated with an example embodiment of the invention to form a dielectric layer 620 containing an ALD-deposited gate insulator layer. The use of high-k dielectrics such as $HfO_2$, $ZrO_2$, $La_2O_3$ and $Ta_2O_5$, HfLaO, and HfZrO deposited through methods and systems forming example embodiments of the present invention provides for fabrication of increasingly smaller transistors that have improved leakage currents and other characteristics such compared with traditional silicon oxide-type dielectrics. A substrate 605 is prepared for deposition, typically a silicon or silicon-containing material. As described above in relation to substrate types, however, other semiconductor materials such as germanium, gallium arsenide, and silicon-on-sapphire substrates may also be used. Prior to depositing a gate dielectric 620, various layers within the substrate 605 of the transistor are formed and various regions of the substrate are prepared, such as the drain diffusion 610 and source diffusion 615 of the transistor 600. The substrate 605 is typically cleaned to provide an initial substrate depleted of its native oxide. The substrate may also be cleaned to provide a hydrogen-terminated surface to improve the rate of chemisorption. The sequencing of the formation of the regions of the transistor being processed may follow typical sequencing that is generally performed in the fabrication of a MOS transistor, as is known to those skilled in the art.

In various embodiments, the dielectric 620 covering the area on the substrate 605 between the source and drain diffused regions 615 and 610 is deposited by the ALD process described in accordance with FIG. 1 of the present invention, and comprises a layer of a metal oxide in molecular proportion that was deposited through at least partial exposure to NxOy species-bearing gasses. The single dielectric layer 620 shown is merely one embodiment, and may in other embodiments also include additional layers of thin-film metal oxides or other suitable dielectrics or barrier materials deposited in accordance with some embodiments of the present invention.

The transistor 600 has a conductive material forming a single gate electrode 625 over the gate dielectric 620. Typically, forming the gate 625 may include forming a polysilicon layer, though a metal gate may be formed in an alternative process. Fabricating the substrate 605, the source and drain regions 615 610, and the gate 625, is performed by using standard processes known to those skilled in the art or those processes enhanced by some embodiments of the present invention. Additionally, the sequencing of the various elements of the process for forming a transistor is conducted with standard fabrication processes, also as known to those skilled in the art.

In the illustrated embodiment, the dielectric layer 620 is shown as being the first layer and in direct contact with the substrate 605; however, the invention is not so limited. In various embodiments, a diffusion barrier layer may be inserted between the dielectric layer 620 and the substrate 605 to prevent metal contamination from affecting the electrical properties of the device. The transistor 600 shown in FIG. 6 has a conductive material forming a single gate electrode 625, but the gate dielectric may also be used in a floating gate device such as flash memory as depicted in FIG. 7.

Figure 7:
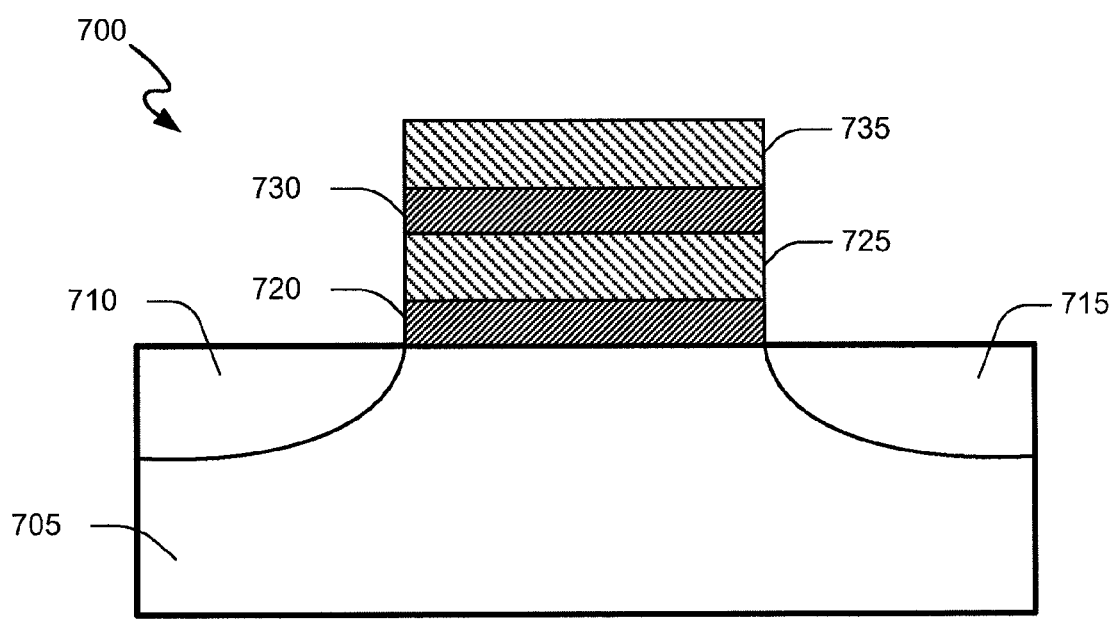
FIG. 7 shows a memory cell with at least one dielectric layer formed by methods consistent with an example embodiment of the present invention.

FIG. 7 illustrates a single memory cell 700 fabricated according to one example embodiment of the invention. In this embodiment, the memory cell 700 is a floating gate memory cell appropriate for use in FLASH or other memory devices. Similar to the transistor 600 shown in FIG. 6, the memory cell 700 includes a substrate 705 (usually silicon but may be other substrates as described herein) in which a source region 715 and a drain region 710 are formed. Typically, memory cell 700 also includes a first dielectric layer 720 (which may be referred to as a tunnel layer), a storage element or floating gate 725 (formed of conductive material such as polysilicon), a second dielectric layer 725, and a control gate 735 (also formed of conductive material such as polysilicon).

Similarly to the transistor 600 described in relation to FIG. 6, the memory cell 700 is fabricated with an example embodiment of the invention to form either or both dielectric layers 720, 730. Dielectric layers 720, 730 may be fabricated in whole or in part by using an ALD-deposited metal oxide gate insulator layer that is formed by methods in accordance with example embodiments the present invention. The substrate 705 is prepared for deposition, typically a silicon or silicon-containing material. As described above in relation to substrate types, however, other semiconductor materials such as germanium, gallium arsenide, and silicon-on-sapphire substrates may also be used. Prior to depositing the dielectric 720, various layers within the substrate 705 of the transistor are formed and various regions of the substrate are prepared, such as the drain diffusion 710 and source diffusion 715 of the memory cell 700. The substrate 705 is typically cleaned to provide an initial substrate depleted of its native oxide. The substrate may also be cleaned to provide a hydrogen-terminated surface to improve the rate of chemisorption. The sequencing of the formation of the regions of the transistor being processed may follow typical sequencing that is generally performed in the fabrication of a MOS transistor, as is well known to those skilled in the art.

In various embodiments, the dielectric 720 covering the area on the substrate 705 between the source and drain diffused regions 715 and 710 is deposited by the ALD process described in accordance with FIG. 1, and comprises a layer of metal oxide deposited through at least partial exposure to NxOy species-bearing gasses. The dielectric layers shown 720, 730 may in other embodiments also include additional layers of metal oxides or other suitable dielectrics or barrier materials.

The memory cell 700 has conductive materials forming a control gate electrode 735 and floating gate 725 in a region over the dielectric 720. Typically, forming the gates 725, 735 may include forming polysilicon layers, though metal gates may be formed in an alternative process. The process to fabricate the substrate 705, the source and drain regions 715 710, and the gate 725, 735 is performed using standard processes known to those skilled in the art. Additionally, the sequencing of the various elements of the process for forming a memory cell is conducted with standard fabrication processes, which are also known to those skilled in the art.

In the illustrated embodiment, the dielectric layers 720, 730 are shown as being in direct contact with the substrate 705, the floating gate 725, and the control gate 735. In other embodiments, diffusion barrier layers may be inserted between the dielectric layers 720, 730 and/or the substrate 705, the floating gate 725, and the control gate 735 to prevent metal contamination from affecting the electrical properties of the memory cell 700.

Figure 14:
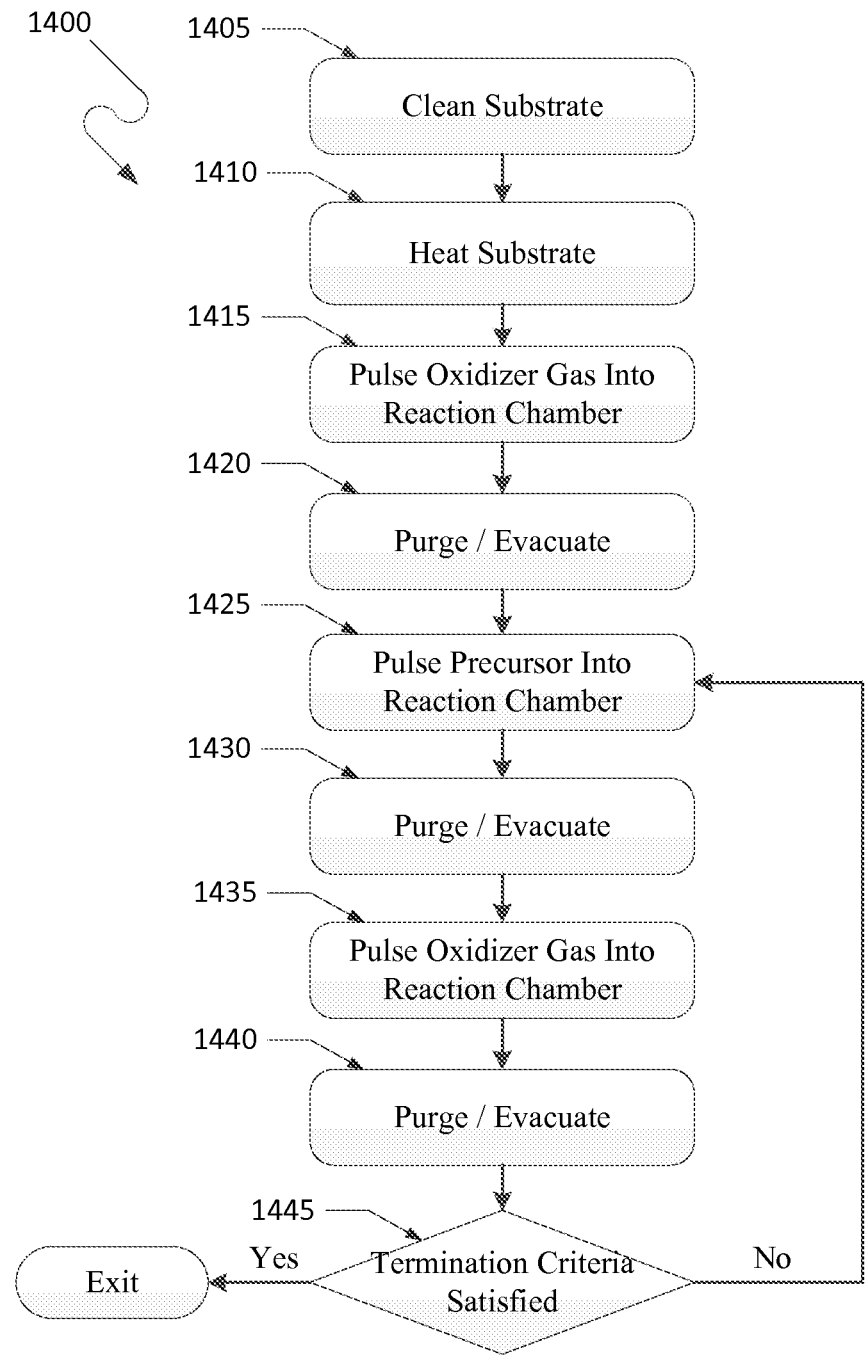
FIG. 14 is a block diagram of an example embodiment of a process that may be utilized in the fabrication of various devices according to an example embodiment of the present invention.
Figure 15:
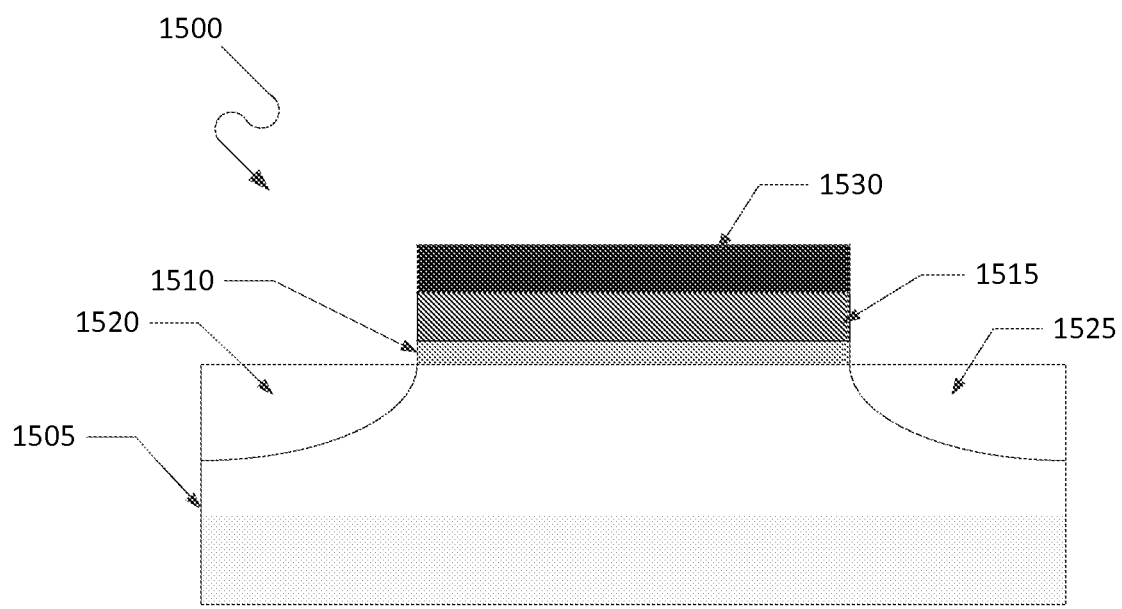
FIG. 15 illustrates an example embodiment of a metal oxide semiconductor (MOS) that may be fabricated from the process depicted in FIG. 14.

FIG. 14 depicts a possible process 1400 that may be utilized in the fabrication of a various devices such as, but not limited to, a MOS like MOS 1800 depicted in FIG. 15. MOS 1500 contains a thin inter oxide layer 1510 between a high dielectric layer 1515 and the substrate 1505. Substrate 1505 may be a wafer of any semiconductor material. For instance, silicon or a silicon containing material may be utilized. In the alternative or in combination, other semiconductor materials such as, but not limited to, germanium, gallium arsenide, and/or silicon-on-sapphire substrates may be utilized. The inter oxide layer 1510 may comprise an oxide of the substrate 1505. In combination or the alternative, the inter oxide layer may comprise the oxide of another material deposited on the substrate 1505. Nitrogen from a nitrogen containing oxidizer may also be deposited within oxide layer 1510, possibly increasing the dielectric constant of layer 1510. The high dielectric layer 1515 above the inter oxide layer 1510 may comprise a dielectric material containing oxygen and at least one additional element, such as lanthanum, hafnium, silicon, tantalum, titanium, aluminum, zirconium, or combinations thereof. In addition to the layers 1510 and 1515 deposited onto substrate 1505, MOS 1500 comprises a gate 1530. Any conductive material may be utilized to form gate 1530. For example, gate 1530 may be formed from polysilicon and/or a metal deposited onto dielectric layer 1515. MOS 1500 may also comprise a source region 1520 and/or a drain region 1525.

Cleaning the substrate 1505 at 1405 may assist in depositing the inter oxide layer 1510. Various methods of cleaning substrate 1505 to remove native oxides and/or expose a surface capable of receiving the desired oxide layer 1510 may be utilized. For example, dipping substrate 1505 in a solution of hydrofluoric acid and rinsing with de-ionized water may remove native oxides from substrate 1505.

Heating substrate 1505 at 1410 within the reaction chamber may also assist in depositing the inter oxide layer 1510. Maintaining the temperature of the reaction chamber at approximately 130° C. to 300° C. may sufficiently heat substrate 1505.

Exposing the substrate within the reaction chamber to an oxidizer comprising an oxidant gas and a nitrogen containing gas at 1415 deposits inter oxide layer 1510 onto substrate 1505. The oxidant gas may be any oxidizing agent, such as but not limited to ozone. The ozone within the oxidant gas may be generated in a variety of manners. For example, the plasma discharge form an ozone generator connected to the reaction chamber may generate the ozone from a stream of an oxygen containing gas and a nitrogen containing gas such as, but not limited to, $O_2$ and $N_2$. In addition to providing the oxidant gas, an ozone generator connected to the reaction chamber may allow deposition of the inter oxide layer 1510 and formation of the oxidant gas to occur in-situ limiting and/or preventing air breaks. Generating ozone from a $N_2/O_2$ mixture having a $N_2/O_2$ ratio of less than one percent may minimize the equivalent oxide thickness. Maintaining high ozone dilution may also minimize the thickness of the inter oxide layer 1510. Limiting the ozone concentration of the first oxidizer gas to 5 to 25 atomic percent and injecting the oxidant gas into the chamber at a flow rate of approximately 100-500 standard cubic centimeters per minutes within a total flow of 3200 standard cubic centimeters per minute may assist in further minimizing the thickness of the layer 1510. For example, feeding a gas containing 12 atomic percent ozone generated by exposing a 2.5 standard liter per minute flow of $O_2$ and 5 standard cubic centimeter per minute flow of $N_2$ to a plasma discharge into a 300° C. reaction chamber at 100 standard cubic centimeters per minute within a total flow of 32000 standard cubic centimeters per minute for approximately 30 to 60 second may deposit a $SiO_2$ inter oxide layer 1810 on substrate 1805 of approximately 3 to 3.75 Angstroms.

Nitrogen within the oxidizer gas may be incorporated into inter oxide layer 1510 formed on substrate 1505 at 1415. This may increase the dielectric constant of inter oxide layer 1510. Embodiments of MOS 1500 in which high dielectric layer 1515 and/or other layers are formed from deposing $HfO_2$, $Ta_2O_5$ and/or like molecules, a higher $N_2$ addition may be desired. Achieving a higher $N_2$ addition may be accomplished by exposing the substrate 1505 within the reaction chamber to an oxidizer comprising ozone gas generated from an $N_2/O_2$ mixture have a $N_2/O_2$ flow ratio of at least 0.072 at 1415.

The first oxidizer gas may be purged and/or evacuated from the chamber at 1420. Evacuating or otherwise pumping the first oxidizer gas out of the chamber may purge the chamber. In combination or the alternative, introducing a gas such as, but not limited to, argon, nitrogen, helium, hydrogen, forming gas or combinations thereof that will not adversely react with the substrate and/or oxide layer into the reaction chamber to displace the first oxidant may be utilized to purge the chamber. Purging time may be selected to be any suitable time capable of evacuating the chamber.

Depending on the exact variant of ALD utilized, it may be desirable not to purge the reaction chamber but proceed instead to the introduction of a precursor gas at 1425. The precursor gas utilized to form dielectric layer 1515 may be injected with or without a carrier gas that will not adversely react with the precursor gas, substrate and/or oxide layer, such as, but not limited to, argon, nitrogen, helium, hydrogen, forming gas or combinations thereof. The precursor gas may include any appropriate metal, including one or more rare earth metals such as, but not limited to, Sc, La, Ce, Pr, Nd, Sm, Eu, Gd, Th, Dy, Ho, Er, Tm, Yb and/or Lo. In combination or the alternative, the precursor gas may comprise any desired metallic, organo-metallic, or metal halide compounds, including, but not limited to hafnium tetrachloride ($HfCl_4$) titanium tetrachloride ($TiCl_4$), tantalum pentachloride ($TaCl_5$), tantalum pentaflouride ($TaF_5$), zirconium tetrachloride ($ZrCl_4$), rare earth betadiketonate compounds including $La(THD)_3$ and $Y(THD)_3$, rare earth cyclopentadienyl (Cp) compound including $La(iPrCP)_3$, rare earth amidinate compounds including lanthanum tris-formamidinate $La(FMD)_3$, cyclooctadienyl compounds including rare earth metals, alkylamido compounds including: tetrakis-ethyl-methylamino hafnium (TEMAHf), tetrakis (diethylamino) hafnium ($Et_2N)_4Hf$ or TDEAH) and tetrakis (dimethylamino) hafnium (($Me_2N)_4Hf$ or TDMAH), alkoxides, halide compounds of silicon, silicon tetrachloride, silicon tetraflouride and/or silicon tetraiodide. Injection of the precursor gas into the reaction chamber deposits a thin layer of the compounds within the gas onto inter oxide layer 1510.

After a predetermined exposure time to the precursor gas ranging from approximately 300 milliseconds to 5 seconds or approximately 1 to 3 seconds, the precursor gas is purged at 1430 from the reaction chamber. Evacuating or otherwise pumping the precursor gas out of the chamber may purge the chamber. In combination or the alternative, introducing a gas such as, but not limited to, argon, nitrogen, helium, hydrogen, forming gas or combinations thereof that will not adversely react with the precursor gas, substrate and/or oxide layer into the chamber to displace the precursor gas may be utilized to purge the chamber. Purging time may be selected to be any suitable time capable of evacuating the chamber such as approximately 3 to 10 seconds or approximately 500 milliseconds to 5 seconds.

Oxidizing the precursor deposited onto inter layer 1510 with a second oxidizer gas introduced into the reaction chamber at 1435 forms high dielectric layer 1415. The second oxidizer gas may comprise an oxidant and/or a nitrogen containing species gas. The nitrogen species may be an $N_xO_y$ species, where "x" and "y" designate any appropriate whole number integers. Utilizing nitrogen and oxygen compounds, particularly excited N—O species obtained from exposure of the component gases to a plasma source, may promote uniform growth of the dielectric layer 1515. In combination or the alternative, including activated N—O species, such as but limited to NO, $N_2O$, $NO_2$, $NO_3$ and/or $N_2O_5$ in the form of ionic and/or free radicals within the second oxidizer may enhance the deposition of the dielectric layer 1515.

The oxidant gas within the second oxidizer gas may comprise any appropriate oxidant. A nitrogen containing species gas may serve as the oxidant gas. In combination or the alternative, the oxidant may contain ozone in combination with one or more gases such as, but not limited to O, $O_2$, NO, $N_2O$, $NO_2$, $NO_3$, $N_2O_5$, an $N_xO_y$ radical species, an $N_xO_y$ ionic species, an $N_xO_y$ molecular species or combinations thereof. The second oxidizer gas may include various active concentrations of ozone, including approximately 5 to 25 atomic percent ozone and 12 to 18 atomic percent ozone. Subjecting a flow of $O_2$ and a nitrogen containing gas such as, but not limited to, $N_2$, NO, $N_2O$, $NO_2$, $NO_3$ and/or $N_2O_5$ to a plasma discharge may be utilized to generate the ozone and/or $N_xO_y$ species within the second oxidizer gas. Other methods of generating ozone and/or a $N_xO_y$ species may be equally as effectively. Additionally, any desired flow $N_2/O_2$ ratio may be utilized to generate the ozone and $N_xO_y$ species, including flow ratios exceeding 0.1 percent, such as 5 standard cubic centimeters per minute $N_2$ to 2 standard liters per minute $O_2$.

At the conclusion of a determined pulse interval, the second oxidizer gas is purged at 1440. Exposure to the second oxidizer gas may continue for any range of time such as, approximately 50 milliseconds to 2 or 10 seconds. Evacuating or otherwise pumping the oxidant gas out of the chamber may purge the chamber. In combination or the alternative, introducing a gas such as, but not limited to, argon, nitrogen, helium, hydrogen, forming gas or combinations thereof that will not adversely react with the oxidant gas, substrate and/or oxide layer into the chamber to displace the precursor gas may be utilized to purge the chamber. Purging time may be selected to be any suitable time capable of evacuating the chamber, such as approximately 3 to 10 seconds or approximately 500 milliseconds.

After the second oxidizer gas has been purged, a determination is made at 1445 whether to continue depositing dielectric layer 1515 by returning to 1425 and introducing a second pulse interval of the same and/or different precursor gas or to terminate the process. The determination may be based on any desired criteria such as, but not limited to, the number of precursor gas pulse sequences required to achieve a particular concentration, thickness, and/or uniformity of a dielectric layer 1515.

Embodiments of methods for forming metal oxide dielectric layers may also be applied to methods to fabricate capacitors in various integrated circuits, memory devices, and electronic systems. In an embodiment for fabricating a capacitor, a method includes forming a first conductive layer, forming a dielectric layer containing a metal oxide layer on the first conductive layer by embodiments of the ALD cycle described herein, and forming a second conductive layer on the dielectric layer. ALD formation of the metal oxide dielectric layer allows the dielectric layer to be engineered within a predetermined composition providing a desired dielectric constant and/or other controllable characteristics.

Figure 8:
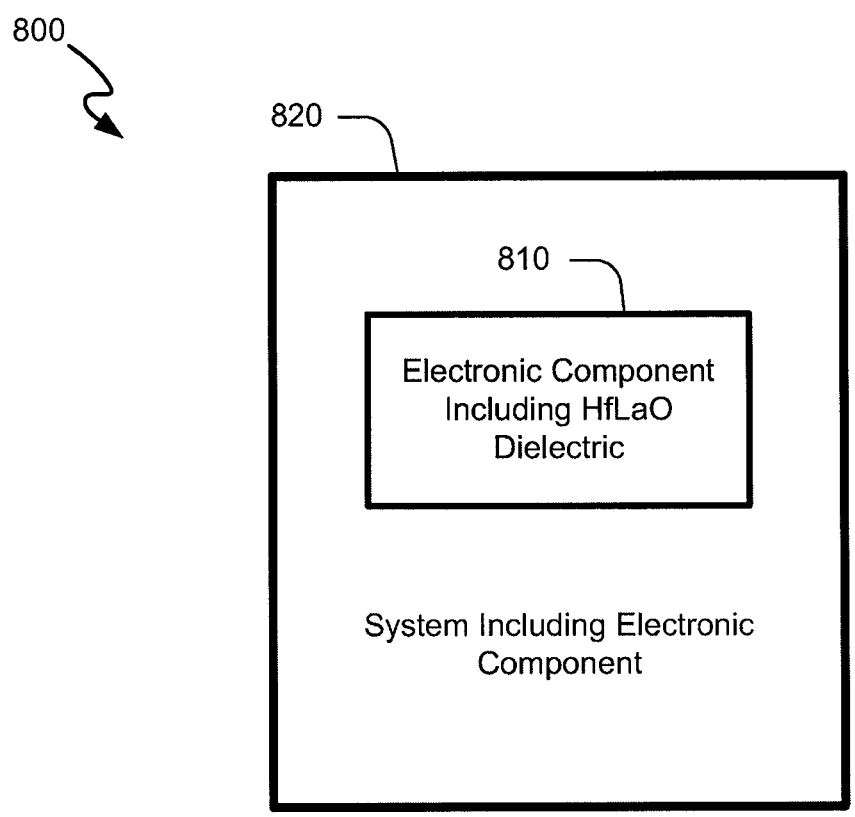
FIG. 8 illustrates a general system incorporating an electronic component that includes a dielectric layer formed by methods consistent with an example embodiment of the present invention.
Figure 9:
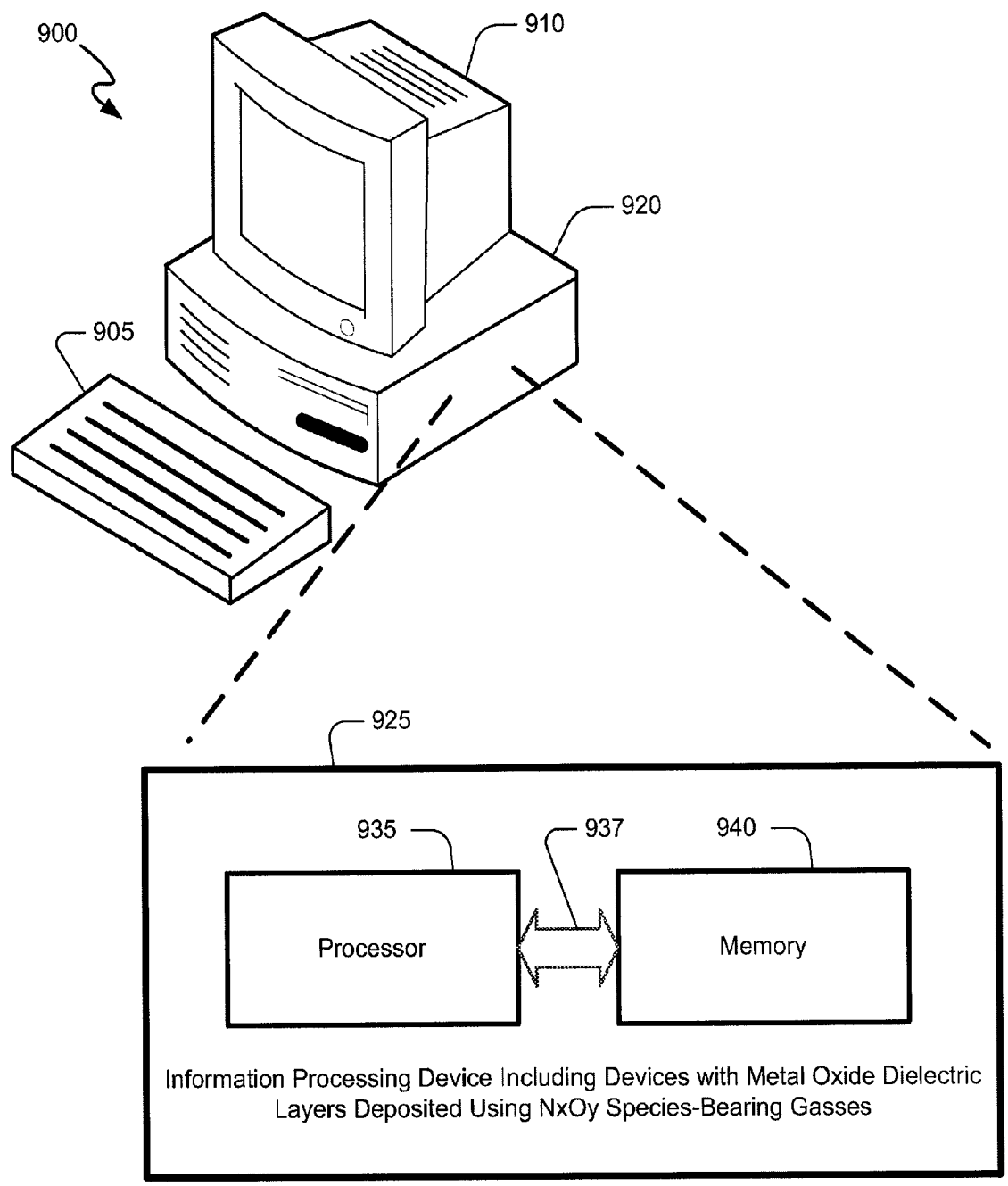
FIG. 9 shows an information processing device such as a computer that incorporates electronic components including a dielectric layer formed by methods consistent with an example embodiment of the present invention.
Figure 10:
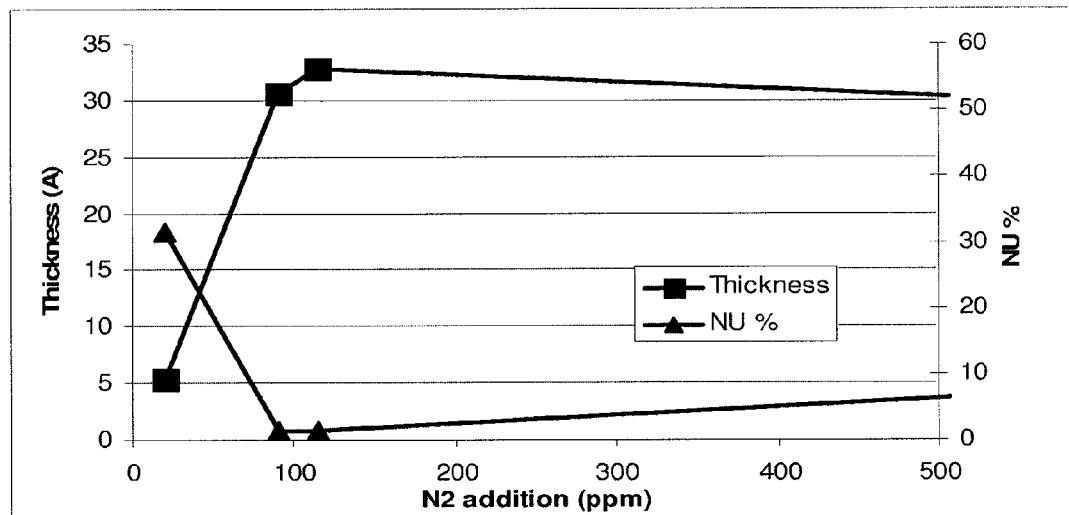
FIG. 10 shows a chart depicting another trial measuring thickness and uniformity of deposited hafnium oxide when nitrogen feed gas concentration was being varied, and represents the leftmost portion of FIG. 11.
Figure 11:
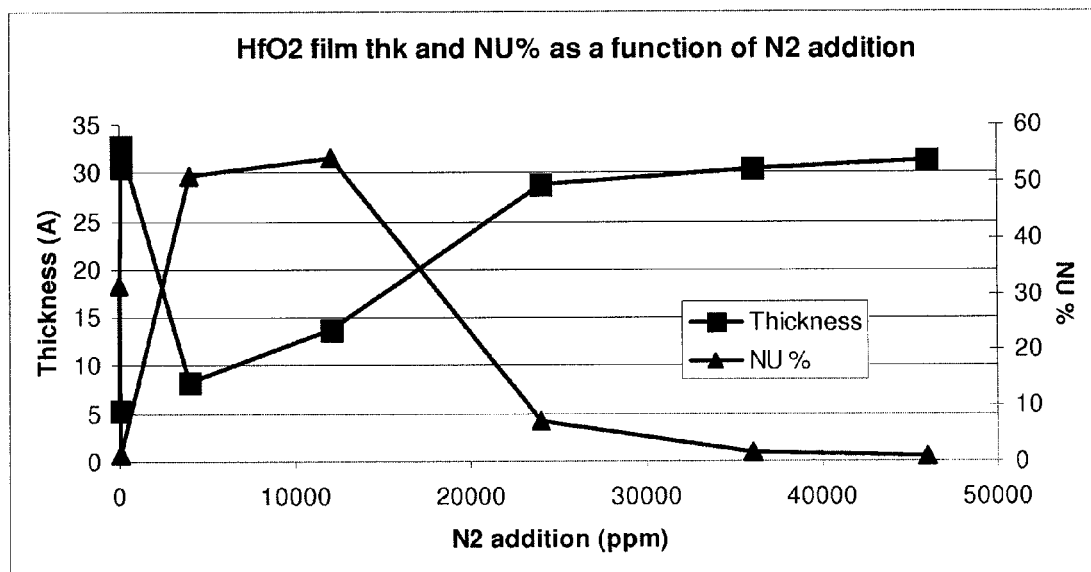
FIG. 11 shows a chart depicting a trial measuring thickness and uniformity of deposited hafnium oxide when nitrogen feedgas concentration was being varied according to an example embodiment of the present invention.
Figure 12:
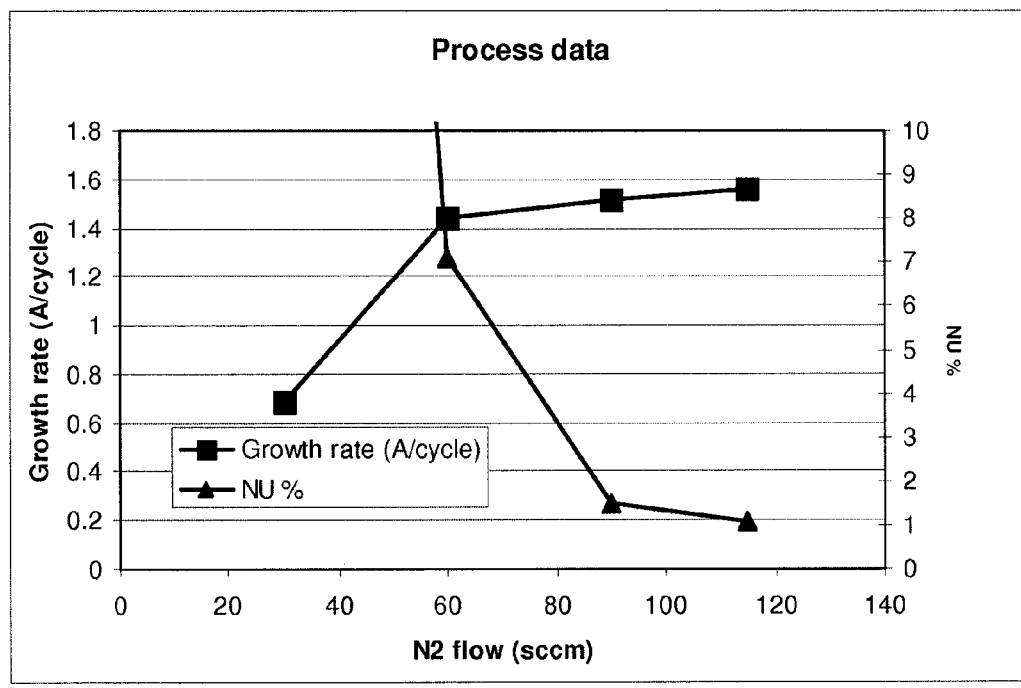
FIG. 12 shows a chart depicting a trial measuring thickness and uniformity of deposited hafnium oxide when nitrogen feedgas flow rate was being varied according to an example embodiment of the present invention.
Figure 13:
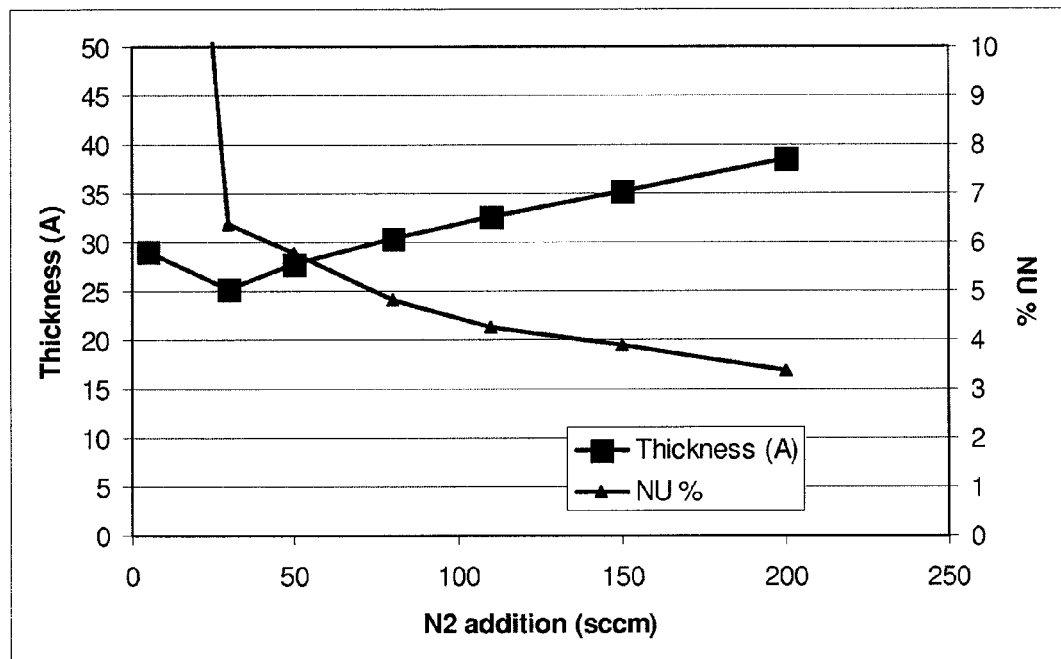
FIG. 13 illustrates a chart showing improvements of the thickness and uniformity of a deposited lanthanum oxide film as an amount of nitrogen feedgas supplied to an ozone generator is increased according to an example embodiment of the present invention.

Electronic components such as transistors, capacitors, and other devices having dielectric layers fabricated by embodiments of the present invention described herein may be implemented into memory devices, processors, and electronic systems. Generally, as depicted in FIG. 8, such electronic components 810 may be incorporated into systems 820 such as information processing devices. Such information processing devices may include wireless systems, telecommunication systems, mobile subscriber units such as cellular phones and smart phones, personal digital assistants (PDAs), and computers. An embodiment of a computer including components having a dielectric layer, such as an HfLaO dielectric layer, formed by atomic layer deposition using methods described herein is shown in FIG. 9 and described below. While specific types of memory devices and computing devices are shown below, it will be recognized by one skilled in the art that several types of memory devices and electronic systems including information handling devices utilize the present subject matter.

A personal computer 900, as shown in FIG. 9, may include an output device such as screen or monitor 910, keyboard input device 905 and a central processing unit 920. Central processing unit 920 typically may include circuitry 925 that utilizes a processor 935, and a memory bus circuit 937 coupling one or more memory devices 940 to the processor 935. The processor 935 and/or memory 940 of the personal computer 900 also includes at least one transistor or memory cell having a dielectric layer formed by atomic layer deposition using methods described herein according an embodiment of the present subject matter. Those of skill in the art are aware that other electronic components in the computer 900 may utilize a dielectric layer formed by atomic layer deposition using methods described herein, such as those formed through at least partial exposure to NxOy species-bearing gasses. Such components may include many types of integrated circuits including processor chip sets, video controllers, memory controllers, I/O handlers, BIOS memory, FLASH memory, audio and video processing chips, and the like. Those of skill in the art also appreciate that other information handling devices such as personal digital assistants (PDAs) and mobile communication devices such as cell phones and smart phones may incorporate dielectric layers that are formed by using embodiments of the present invention.

Other embodiments of the invention will be apparent to those skilled in the art from consideration of the specification and embodiments disclosed herein, and as supplemented by the technical disclosure described in the following exemplary claims.

What is claimed is:

1. A method for depositing stacked layers on a substrate within a reaction chamber, the method comprising applying an atomic layer deposition cycle to the substrate, the cycle comprising:
    exposing the substrate to a precursor gas for a precursor pulse interval then removing the precursor gas;
    forming active $N_xO_y$ species;
    introducing the active $N_xO_y$ species to a reaction chamber;
    exposing the substrate to an oxidizer gas comprising an oxidant gas and the active $N_xO_y$ species for an oxidation pulse interval; and
    prior to introducing the active $N_xO_y$ species to the reaction chamber, monitoring the active $N_xO_y$ species and adjusting one or more process parameters based on the monitoring.

2. The method according to claim 1, wherein said exposing the substrate to the oxidizer gas occurs prior to said exposing the substrate to the precursor gas.

3. The method according to claim 2, wherein said oxidant gas comprises ozone generated from a mixture of $O_2$ and $N_2$ having a $N_2/O_2$ ratio of less than one percent for a sufficient time to deposit an oxide layer on the substrate.

4. The method according to claim 2, further comprising exposing the substrate to a second oxidizer gas comprising an oxidant gas for an oxidation pulse interval then removing the second oxidizer gas.

5. The method according to claim 4, wherein the second oxidizer gas further comprises a nitrogen containing species gas.

6. The method according to claim 4, wherein the oxidant gas of the second oxidizer gas comprises a nitrogen containing species gas.

7. The method according to claim 4, wherein the oxidant gas of the second oxidizer gas comprises approximately 5 to 25 atomic percent ozone.

8. The method according to claim 7, wherein said ozone is produced form a mixture of an oxygen and a nitrogen source gas subjected to a plasma discharge.

9. The method according to claim 8, wherein the flow ratio of said nitrogen source gas to said oxygen source gas is greater than 0.001.

10. The method according to claim 8, wherein the flow ratio of said nitrogen source gas to said oxygen source gas is at least 0.072.

11. The method according to claim 1, wherein the temperature of the chamber during exposure of the substrate to the oxidizer gas is approximately 130° C. to 300° C.

12. The method according to claim 1, wherein said exposing the substrate to the oxidizer gas occurs after said exposing the substrate to the precursor gas.

13. A method of manufacturing a semiconductor comprising:
    disposing a dielectric layer upon a substrate;
    forming an inter oxide layer between said dielectric layer and substrate by exposing said substrate to a combination of a gas comprising ozone generated from a mixture of $O_2$ and $N_2$ having a $N_2/O_2$ ratio of less than one percent and an excited nitrogen-containing species gas, said combination introduced to a reaction chamber; and prior to introducing the combination to the reaction chamber, monitoring active $N_xO_y$ species and adjusting one or more process parameters based on the monitoring.

14. The method according to claim 13, wherein the excited nitrogen-containing species gas comprises an excited $N_xO_y$ radical species, an excited $N_xO_y$ ionic species and combinations thereof.

15. The method according to claim 13, wherein the excited nitrogen-containing species gas comprises activated or radical species selected from the group consisting of NO, $N_2O$, $NO_2$, $NO_3$, $N_2O_5$ and combinations thereof.

16. The method according to claim 13, wherein the gas said substrate is exposed to form said inter oxide layer comprises approximately 5 to 25 atomic percent ozone.

17. The method according to claim 13, wherein the step of disposing a dielectric layer upon a substrate comprises exposing the substrate to a precursor gas, the precursor gas comprising a rare earth metal selected from the group consisting of Sc, La, Ce, Pr, Nd, Sm, Eu, Gd, Th, Dy, Ho, Er, Tm, Yb, Lu, and combinations thereof.

18. The method according to claim 13, wherein the step of disposing a dielectric layer upon a substrate comprises exposing the substrate to a precursor gas, the precursor gas comprising at least one of an organo-metallic and a metal halide compound.

19. The method according to claim 13, wherein the step of disposing a dielectric layer upon a substrate comprises exposing the substrate to a precursor gas, the precursor gas comprising at least one of:

hafnium tetrachloride ($HfCl_4$);
titanium tetrachloride ($TiCl_4$);
tantalum pentachloride ($TaCl_5$);
tantalum pentafluoride ($TaF_5$);
zirkonium tetrachloride ($ZrCl_4$);
rare earth betadiketonate compounds including (La$(THD)_3$) and (Y$(THD)_3$);
rare earth cyclopentadienyl (Cp) compounds including La(iPrCp)$_3$;
rare earth amidinate compounds including lanthanum tris-formamidinate La(FAMD)$_3$;
cyclooctadienyl compounds including rare earth metals;
alkylamido compounds including:
 tetrakis-ethyl-methylamino hafnium (TEMAHf);
 tetrakis (diethylamino) hafnium (($Et_2N)_4$Hf or TDEAH); and
 tetrakis (dimethylamino) hafnium (($Me_2N)_4$Hf or TDMAH);
alkoxides;
halide compounds of silicon;
silicon tetrachloride;
silicon tetrafluoride; and
silicon tetraiodide.

* * * * *